(12) United States Patent
Yoshida et al.

(10) Patent No.: US 11,222,688 B2
(45) Date of Patent: Jan. 11, 2022

(54) SEMICONDUCTOR DEVICE

(71) Applicant: RENESAS ELECTRONICS CORPORATION, Tokyo (JP)

(72) Inventors: Masahiro Yoshida, Tokyo (JP); Toshihiko Funaki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/060,510

(22) Filed: Oct. 1, 2020

(65) Prior Publication Data

US 2021/0110861 A1 Apr. 15, 2021

(30) Foreign Application Priority Data

Oct. 15, 2019 (JP) .............................. JP2019-188734

(51) Int. Cl.
*G11C 11/40* (2006.01)
*G11C 11/4076* (2006.01)
*H01L 25/065* (2006.01)

(52) U.S. Cl.
CPC ...... *G11C 11/4076* (2013.01); *H01L 25/0657* (2013.01); *H01L 2225/06506* (2013.01); *H01L 2225/06513* (2013.01); *H01L 2225/06541* (2013.01); *H01L 2225/06562* (2013.01)

(58) Field of Classification Search
None
See application file for complete search history.

(56) References Cited

U.S. PATENT DOCUMENTS

| | | | | |
|---|---|---|---|---|
| 7,061,941 B1* | 6/2006 | Zheng | ................. | G11C 7/1051 365/230.02 |
| 7,912,167 B2 | 3/2011 | Saeki | | |
| 2009/0245010 A1* | 10/2009 | Searles | ............... | G06F 13/1689 365/230.06 |
| 2012/0294095 A1* | 11/2012 | Shiu | ..................... | G11C 7/1057 365/189.11 |
| 2015/0049849 A1* | 2/2015 | Chen | ........................ | H03L 7/00 375/376 |

FOREIGN PATENT DOCUMENTS

JP 2007-208616 A 8/2007

* cited by examiner

*Primary Examiner* — Tan T. Nguyen
(74) *Attorney, Agent, or Firm* — McDermott Will & Emery LLP

(57) ABSTRACT

The data transfer has room for improvement of reduction in the operating electric current flowing on the signal bus and correct acquisition of the large amount of data. Each of data, a first clock signal and a second clock signal, a phase of which shifts by a predetermined amount from the first clock signal, has an amplitude that is smaller than an amplitude of a power supply voltage, and each of a semiconductor device and a memory device takes input of data in synchronization with rise edges of first and second clock signals.

20 Claims, 31 Drawing Sheets

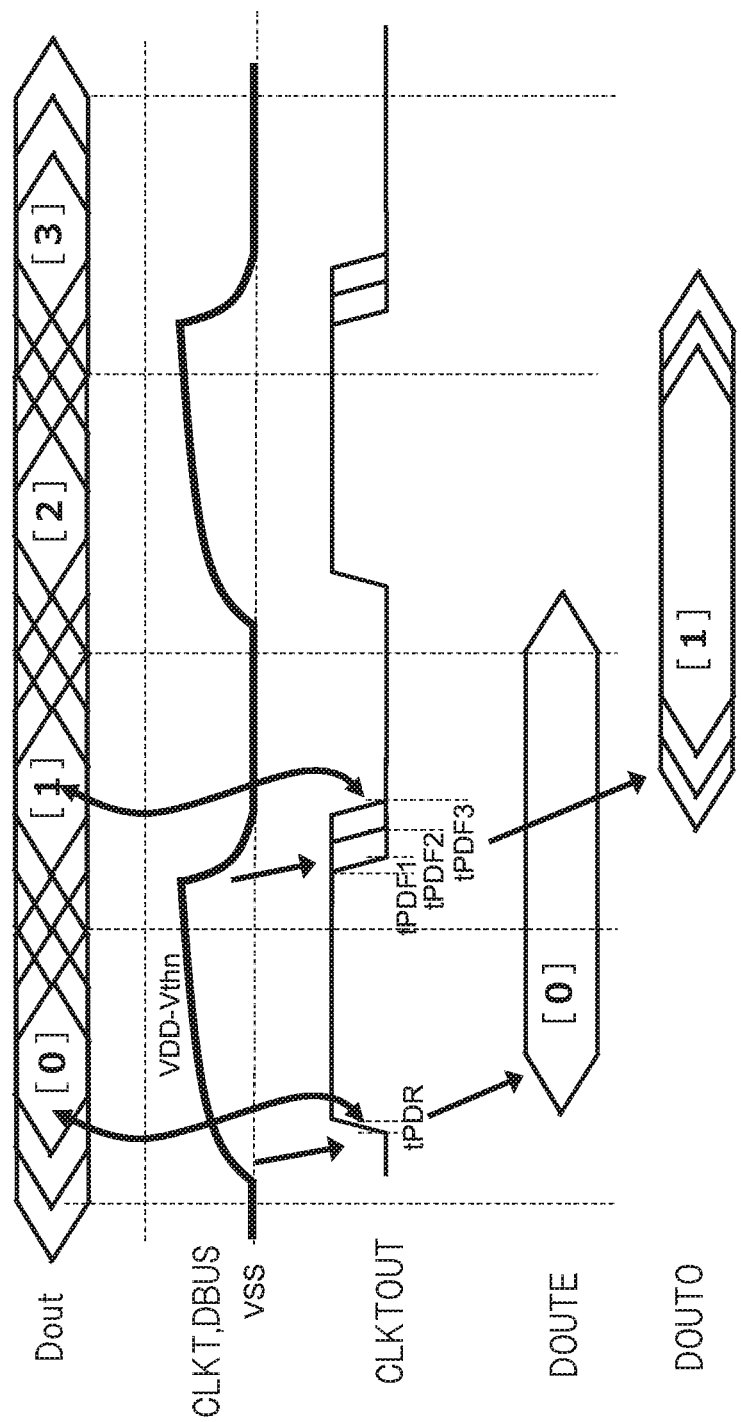

SEMICONDUCTOR DEVICE

CROSS-REFERENCE TO RELATED APPLICATION

The present application claims priority from Japanese Patent Application No. 2019-188734 filed on Oct. 18, 2019, the content of which is hereby incorporated by reference into this application.

TECHNICAL FIELD OF THE INVENTION

The present invention relates to semiconductor system. For example, the present invention relates to a semiconductor system in which data is transferred between a memory and a system-on chip device, each of which is made of a silicon single chip.

BACKGROUND OF THE INVENTION

AI (Artificial Intelligence) and system-on chip devices (SoC) for use in Cognitive application need to mount neural-network compatible function such as a large-scale multiply-accumulate (add) computing circuit thereon to simultaneously process a large amount of data. For the necessity of writing/reading repetition for the large amount of data, information such as a weight of the neural network at a high speed, a memory configuration having a large volume in a broadband is demanded. Besides, power increase in operation has become a problem. Therefore, it is more important to reduce a signal bus operating electric current that occupies a lot of consumed electric current in the memory chip or the SoC chip.

Japanese Patent Application Laid-Open Publication No. 2007-208616 (Patent Document 1) describes a semiconductor system that receives data while using multi-phase clock signals and latches the data.

SUMMARY OF THE INVENTION

However, the semiconductor system described in the Patent Document 1 has room for improvement in reduction of the operating electric current flowing on the signal bus and correct acquisition of the large amount of data at the time of the data transfer.

An object of embodiments is to enhance reliability of a high-speed data transfer operation by reducing the consumed electric current of the semiconductor system. Other objects and novel characteristics will be apparent from the description of the present specification and the accompanying drawings.

A semiconductor system according to one embodiment includes: a semiconductor device having a central processor unit and a logic circuit that are formed on one semiconductor chip; and a memory device that is formed on one semiconductor chip, and each of the semiconductor device and the memory device includes a driver circuit and a receiver circuit. Data having a lower amplitude than that of a power supply voltage applied to the driver circuit, a first clock signal, and a second clock signal, a phase of which shifts by a predetermined amount from the first clock signal, are output from the driver circuit, and the receiver circuit takes input of data in synchronization with rise edges of the first and second clock signals.

In the semiconductor system according to one embodiment, the operating electric current on the signal bus can be reduced, and the reliability of the high-speed data transfer operation can be improved.

BRIEF DESCRIPTIONS OF THE DRAWINGS

FIG. 31 is a diagram showing a waveform of each signal that is input to a receiver circuit through a data bus using a low-amplitude driver circuit.

DESCRIPTIONS OF THE PREFERRED EMBODIMENTS

Figure 1:
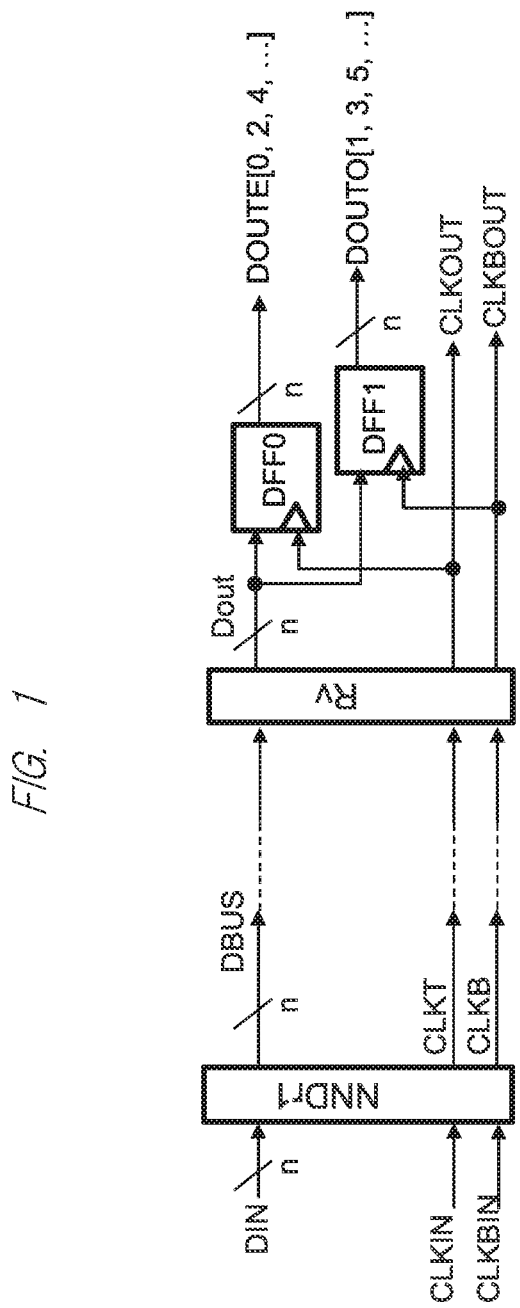
FIG. 1 is a data transfer diagram of a first embodiment.

Hereinafter, a semiconductor system according to one embodiment will be explained in detail with reference to drawings. Note that the same components or the corresponding components are denoted by the same reference symbols throughout the specification and the drawings, and the repetitive explanation thereof will be omitted. In the drawings, for convenience of the explanation, configurations may be omitted or simplified. At least some of embodiments and modification examples may be appropriately combined with each other.

First Embodiment

<<Configuration of Semiconductor System>>

Figure 25:
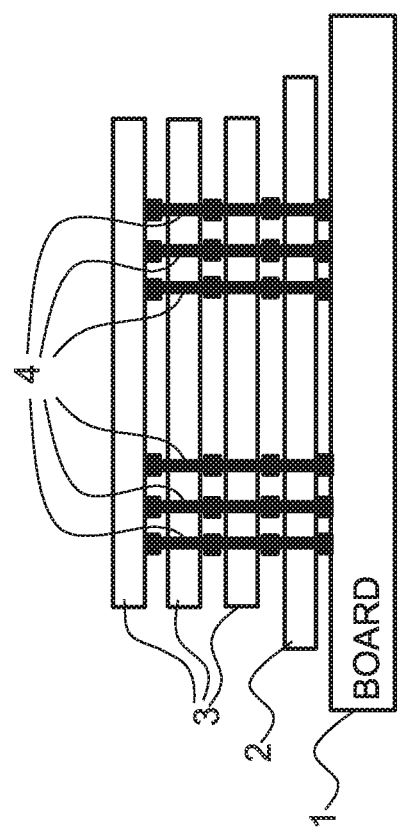
FIG. 25 is a layer cross-sectional diagram of a SoC chip and a memory chip that are layered by using a through electrode.

FIG. 25 is a layer cross-sectional diagram of a SoC chip and a memory chip using a through electrode TSV (Through-Silicon Via).

A numerical symbol "1" indicates a printed board, a numerical symbol "2" indicates the SoC chip, a numerical symbol "3" indicates the memory chip, and a numerical symbol "4" indicates a wiring for use in connecting an electrode of each chip and the printed board. As seen in FIG. 25, the SoC chip 2 and the memory chip 3 that are positioned between the board 1 in the bottom layer and the memory chip in the top layer are connected to each other by the wirings 4 that vertically penetrate the chip.

Figure 26:
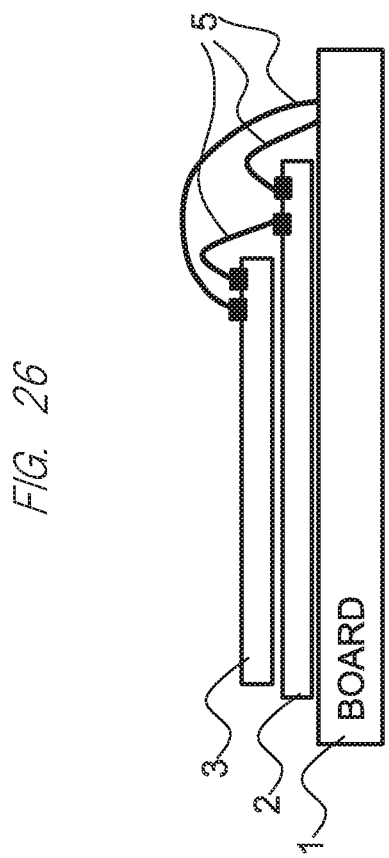
FIG. 26 is a layer cross-sectional diagram of a SoC chip and a memory chip that are layered by using a wire.

FIG. 26 is a layer cross-sectional diagram of the SoC and the memory chip using a wire.

FIG. 26 is different from FIG. 25 in that the board 1, the SoC chip 2 and the memory chip 3 are connected to one another by wires 5.

Figure 21:
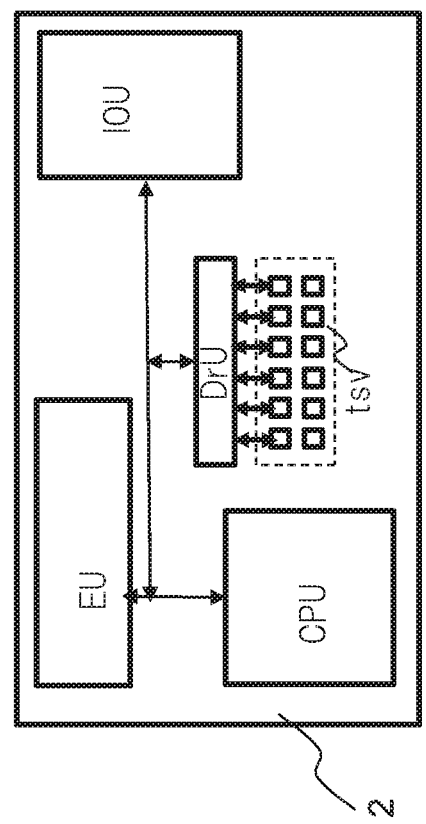
FIG. 21 is a planar layout diagram of a SoC chip that is layered by using a through electrode.

FIG. 21 is a planar layout diagram of the SoC chip that is layered by using the through electrode.

The SoC chip 2 includes a central processor unit CPU, a computing unit EU, an input/output port IOU, a wiring area "tsv" that is connected to the memory chip in the top layer and the board in the bottom layer by the wirings 4, and a driver circuit unit DrU.

The driver circuit unit DrU supplies a signal that is received from the wiring 4 to the central processor unit CPU, the computing unit EU or the input/output port IOU, and supplies a signal to the wiring 4, the signal being received from the central processor CPU, the computing unit EU or the input/output port IOU. The signal that is described here is a control signal including data and address and clock signals.

Figure 22:
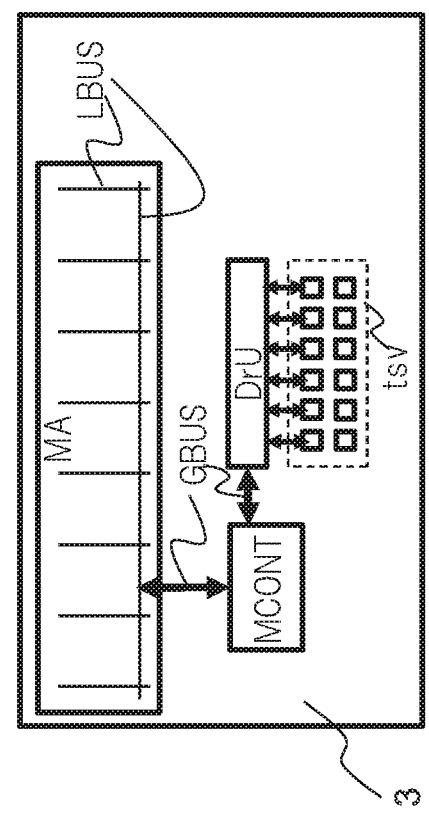
FIG. 22 is a planar layout diagram of a memory chip that is layered by using a through electrode.

FIG. 22 is a planar layout diagram of the memory chip that is layered by using the through electrode.

The memory chip 3 includes a memory array MA, a control circuit MCONT that controls the memory array, a wiring area "tsv" that is connected to a chip in the top layer or the bottom layer by the wirings 4, and a driver circuit unit DrU.

The driver circuit unit DrU supplies a signal that is received from the wiring 4 to the control circuit MCONT, or supplies a signal that is received from the control circuit MCONT to the wiring 4. The signal that is described here is a control signal including data and address and clock signals.

The control circuit MCONT is connected to a local bus LBUS inside the memory array MA through a global bus GBUS.

The memory chip 3 of FIGS. 25 and 26 is, for example, a synchronous DRAM that writes and reads the data in synchronization with the clock signal that is supplied from the SoC chip 2.

Figure 23:
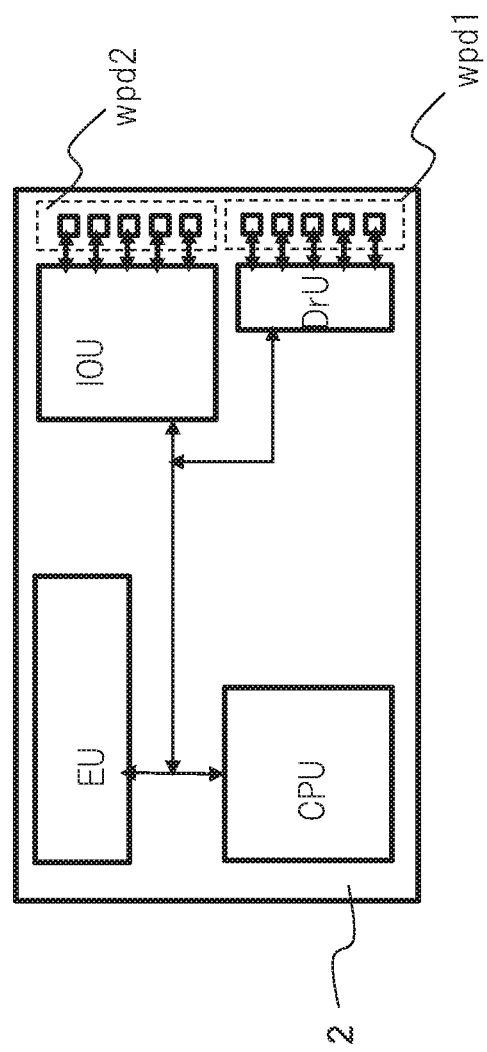
FIG. 23 is a planar layout diagram of a SoC chip that is layered by using a wire.

FIG. 23 is a planar layout diagram of the SoC chip that is layered by using the wires.

The SoC chip 2 includes wiring bonding areas "wpd1" and "wpd2" The SoC chip 2 and the memory chip 3 are connected to each other in the wire bonding area wpd1 by the wires. The SoC chip 2 is connected to the board 1 in the wire bonding area wpd1 by the wires.

Figure 24:
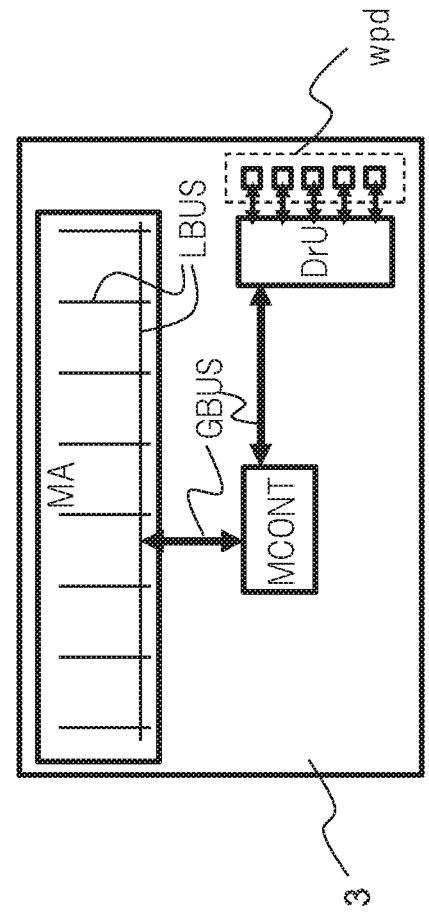
FIG. 24 is a planar layout diagram of a memory chip that is layered by using a wire.

FIG. 24 is a planar layout diagram of the memory chip that is layered by using the wires.

The memory chip 3 includes a wire bonding area "wpd". The memory chip 3 is connected to the top layer, the bottom layer or the board in the wire bonding area wpd by the wires.

<<Details of Driver Circuit Unit (in Comparative Example)>>

Figure 27:
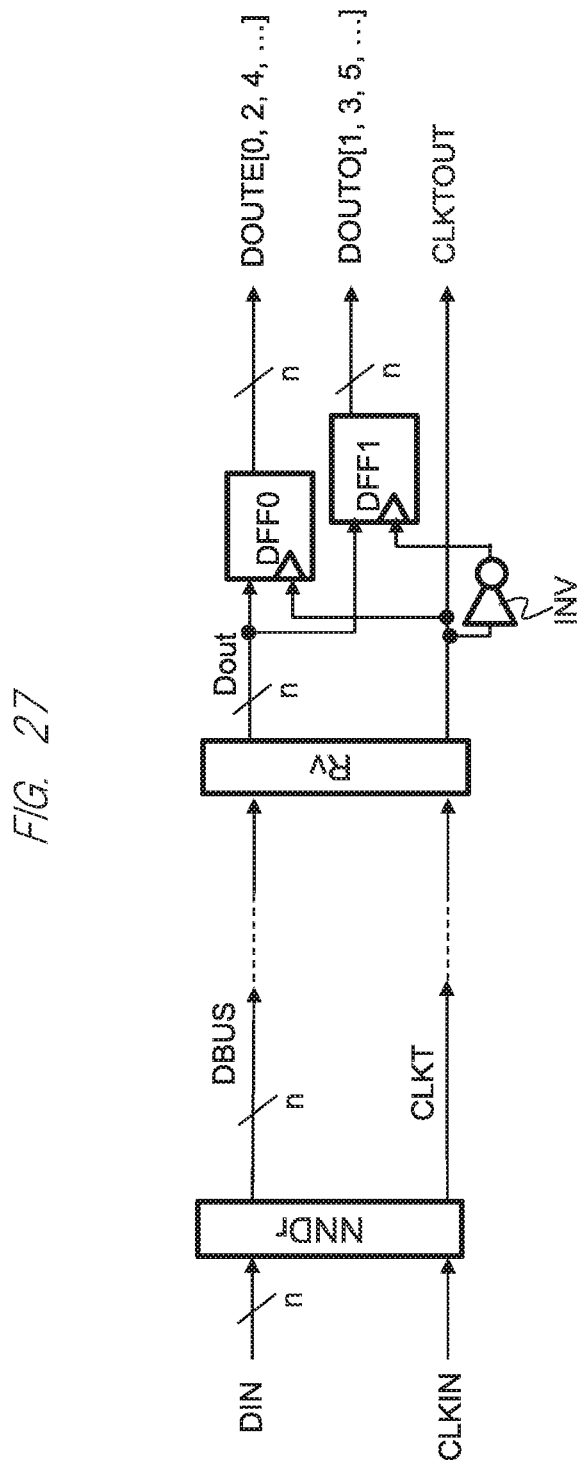
FIG. 27 is a schematic diagram of data transfer using a low-amplitude driver circuit.

FIG. 27 is a schematic diagram of data transfer using a low-amplitude driver circuit.

A low-amplitude driver circuit NNDr, a low-amplitude receiver circuit Rv, latch circuits DFF0 and DFF1 and an inverter circuit INV are included in the driver circuit unit DrU shown in FIGS. 21, 22, 23 and 24. In one example, when the SoC chip 2 of FIG. 21 sends the signal to the memory chip 3 of FIG. 22 through the through electrode (wiring area tsv), the low-amplitude driver circuit NNDr is included in the driver circuit unit DrU inside the SoC chip 2, and the low-amplitude receiver circuit Rv or others is included in the driver circuit unit DrU inside the memory chip 3.

In another example, a configuration shown in FIG. 27 is applicable to not only such a circuit that transfers the data between the chips but also a circuit that transfers the data inside the SoC chip 2 or a circuit that transfers the data inside the memory chip 3.

The low-amplitude driver circuit NNDr has an output circuit made of an N-type MOSFET, takes parallel input of n-bit (n-bit width) data "DIN", and outputs data having a lower amplitude than a voltage amplitude of the data DIN to an n-bit data bus DBUS. The low-amplitude driver circuit NNDr further takes input of a clock signal CLKIN, and outputs a clock signal having a lower amplitude than a voltage amplitude of the clock signal CLKIN to a clock signal line CLKT.

The low-amplitude receiver circuit Rv receives the clock signal and the data each having the lower amplitude that is output from the low-amplitude driver circuit NNDr. The n-bit latch circuits DFF0 and DFF1 are arranged, and a non-inverted clock signal and n-bit data. Dout that are received by the low-amplitude receiver circuit Rv are supplied in parallel to the latch circuit DFF0 while an inverted clock signal that is inverted by the inverter circuit INV and the n-bit Dout are supplied in parallel to the latch circuit DFF1.

The latch circuit DFF0 latches even-numbered data "DOUTE" (0, 2, 4, . . . ) of the n-bit data Dout in synchronization with the non-inverted clock signal, and outputs the latched n-bit data in parallel. The latch circuit DFF1 latches odd-numbered data "DOUTO" (1, 3, 5, . . . ) of the n-bit data Dout in synchronization with the inverted clock signal, and outputs the latched n-bit data in parallel.

A symbol "/n" shown in the following drawings means that there are signal lines corresponding to the number of "n" bits so that the n-bit data is transferred in parallel. The number of the illustrated latch circuits that latch the even-numbered data or the odd-numbered data of the n-bit data is only one for simplifying the drawings. However, the latch circuits are arranged so as to correspond to the number of "n" bits.

Figure 28:
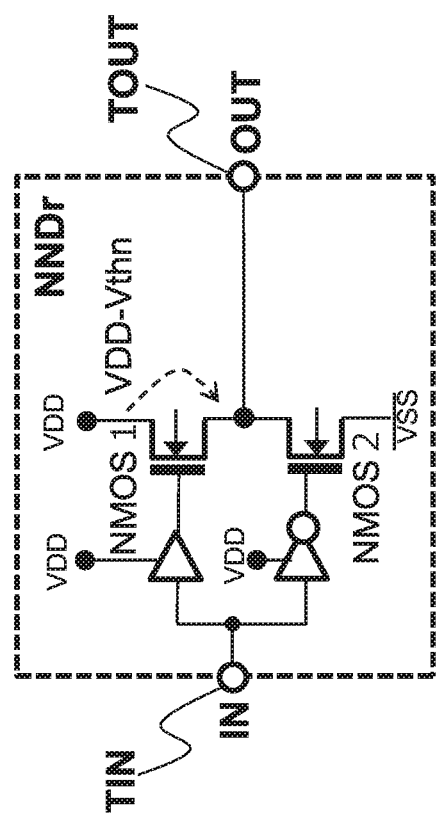
FIG. 28 is a circuit diagram of a low-amplitude driver circuit.

FIG. 28 is a circuit diagram of the low-amplitude driver circuit.

A power supply voltage VDD and a ground potential VSS serving as an operational power supply are supplied to the low-amplitude driver circuit NNDr, and the low-amplitude driver circuit takes input of an input signal IN from an input terminal TIN and outputs an out signal OUT from an output terminal TOUT. N-type MOSFETS 1 and 2 are connected in series, the power supply voltage VDD (of, for example, 1.0 V) is applied to a drain of the N-type MOSFET 1, the input signal IN is supplied from the inter terminal TIN to a gate of the N-type MOSFET 1, and a source of the N-type MOSFET 1 is connected to the output terminal TOUT. The ground potential VSS (of, for example, 0 V) is applied to a source of the N-type MOSFET 2, an inverted signal of the input signal IN is supplied from the input terminal TIN to a gate of the N-type MOSFET 2, and a drain of the N-type MOSFET 2 is connected to the output terminal TOUT.

When the input signal IN having a high level is supplied, the N-type MOSFET 1 is turned ON to output, and a signal having a voltage that is lower by Vth of the N-type MOSFET 1 than the power supply voltage VDD is output as the output signal OUT to the output terminal TOUT. Therefore, when the N-type MOSFETs 1 and 2 are used for the low-amplitude driver circuit NNDr, the amplitude of the signal to be output is decreased, and a charge/discharge electric current to/from a load capacitance is reduced, the charge/discharge electric current being larger as the wiring of the data bus DBUS is longer, and a driving electric current for the data bus DBUS can be reduced.

Note that the input signal IN is the data DIN or the clock signal CLKIN shown in FIG. 27. The low-amplitude driver circuits NNDr receiving the data DIN are arranged so as to correspond to the number of "n" bits.

Figure 29:
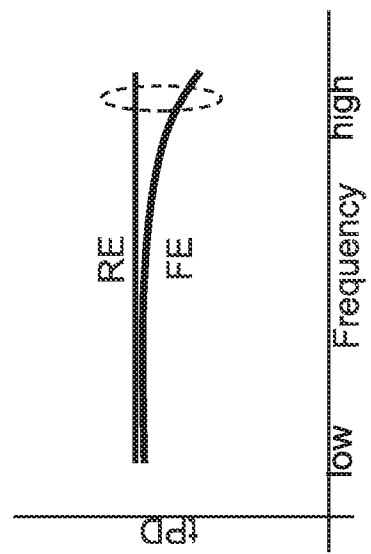
FIG. 29 is a diagram showing frequency characteristics of signal delay between a low-amplitude driver circuit and a receiver circuit.

FIG. 29 is a diagram showing frequency characteristics of signal delay between the low-amplitude driver circuit and the receiver circuit.

A horizontal axis indicates a frequency, and a vertical axis indicates delay "tPD". A symbolic character "RE" indicates characteristics of rise delay with respect to a frequency of a rise edge of a signal, and a symbolic character "FE" indicates characteristics of fall delay with respect to a frequency of a fall edge of a signal. While the delay time of the rise edge of the signal is constant irrelevant to the frequency, the fall delay time of the fall edge of the signal is delayed more as the frequency is higher. The phenomena will be further explained with reference to FIG. 30.

Figure 30:
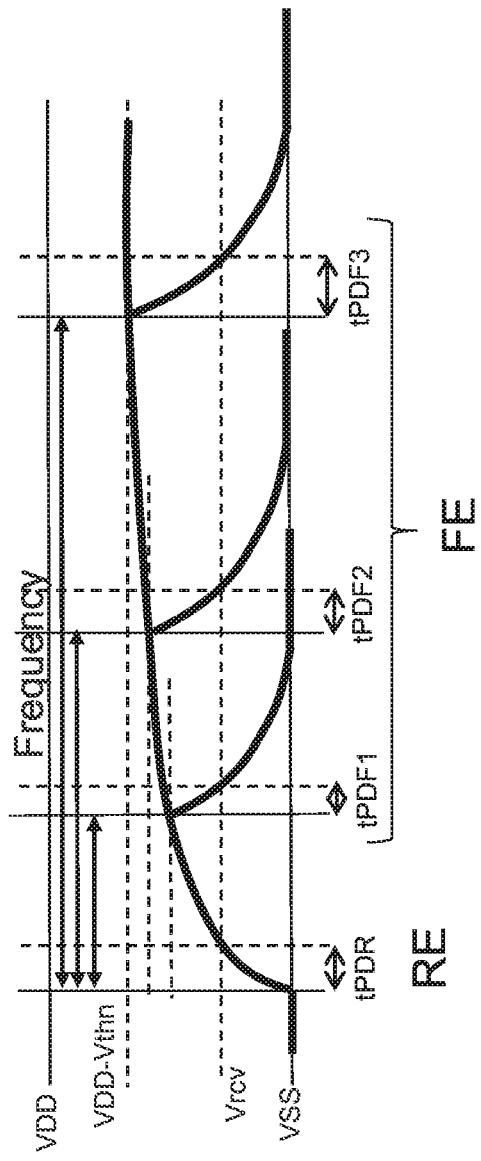
FIG. 30 is a diagram showing dependence of an operating waveform in a low-amplitude driver circuit on a frequency.

FIG. 30 is a diagram showing dependence of the operating waveform of the low-amplitude driver circuit on the frequency.

A symbolic character "Vrcv" indicates a threshold value at which the output voltage of the low-amplitude driver circuit changes from a low level to a high level (or from the high level to the low level). When the output potential becomes high, a gate-source voltage Vg of the N-type MOSFET 1 of the output circuit shown in FIG. 28 becomes small, and a performance of increase in the output voltage rapidly decreases at around VDD-Vth. Therefore, the high-level voltage tends to be low when the time for the output of the output voltage at the high level is short, and the high-level voltage tends to be high when the time for the output of the output voltage at the high level is long. Because of this, a voltage of a start up of the operation of falling down the output voltage is different, and therefore, the delay of the time taken for the change from the high level to the low level changes (tPDF1<tPDF2<tPDF3).

FIG. 31 is a diagram showing a waveform of each signal that is input to the receiver circuit through the data bus while using the low-amplitude driver circuit.

The low-amplitude driver circuit NNDr outputs the clock signal CLKIN to the clock signal line CLKT, and serially outputs the even-numbered data and the odd-numbered date of the n-bit data DIN to the data bus DBUS so that the even-numbered data is output first, and then, the odd-numbered data is output. The potentials of the clock signal line CLKT and the data bus DBUS change from the ground potential VSS to the VDD-Vth and change from the VDD-Vth to the ground potential VSS in accordance with the clock signal and the data that are output from the low-amplitude driver circuit. In this case, in the clock signal that is output from the low-amplitude driver circuit (which results in the clock signal CLKOUT that is output from the low-amplitude receiver circuit Rv), the rise-edge delay time tPDR is stable, while the fall-edge delay time tPDF changes as shown in FIG. 29.

In a system that writes and reads the data in accordance with the clock signal, when the data is transferred by using a bus made of a long wiring, the change in the edge delay of the clock signal adversely narrows a data window for use in correctly acquiring the data at the data receiving side (that is the latch circuits DFF0 and DFF1). Further, the data acquisition time varies, and therefore, the high-speed operational performance adversely significantly deteriorates.

<<Details of Driver Circuit Unit (of First Embodiment)>>

FIG. 1 is a data transfer diagram of a first embodiment. In FIG. 1, a low-amplitude driver circuit that outputs two-phase clock signals is used. The N-type MOSFET is used for the output circuit of the low-amplitude driver circuit as similar to the case of FIG. 28.

A low-amplitude driver circuit NNDr1 is arranged so as to take parallel input of n-bit data DIN, and to output data having a lower amplitude than a voltage amplitude of the data DIN to the data bus DBUS in parallel. Further, the low-amplitude driver circuit NNDr1 takes inputs of a non-inverted clock signal CLKIN and an inverted clock signal CLKBIN, and outputs a clock signal having a lower amplitude than a voltage amplitude of the non-inverted clock signal CLKIN to a clock signal line CLKT and outputs a clock signal having a lower amplitude than a voltage amplitude of the inverted clock signal CLKBIN to a non-inverted clock signal line CLKB.

A low-amplitude receiver circuit Rv receives, in parallel, the n-bit data having the low amplitude that is output from the low-amplitude driver circuit NNDr1, and receives the non-inverted clock signal and the inverted clock signal. The non-inverted clock signal and the data Dout that are received by the low-amplitude receiver circuit Rv are supplied to the latch circuit DFF0, and the inverted clock signal and the data Dout that are received by the low-amplitude receiver circuit Rv are supplied to the latch circuit DFF1.

The latch circuit DFF0 latches the even-numbered data DOUTE (0, 2, 4, . . . ) of the data Dout in synchronization with the rise edge of the non-inverted clock signal, and outputs the latched data. The latch circuit DFF1 latches the odd-numbered data. DOUTO (1, 3, 5, . . . ) of the data Dout in synchronization with the rise edge of the inverted clock signal, and outputs the latched data.

The low-amplitude driver circuit NNDr1 and the low-amplitude receiver circuit Rv are included in the driver circuit unit DrU shown in FIGS. 21, 22, 23 and 24.

Figure 2:
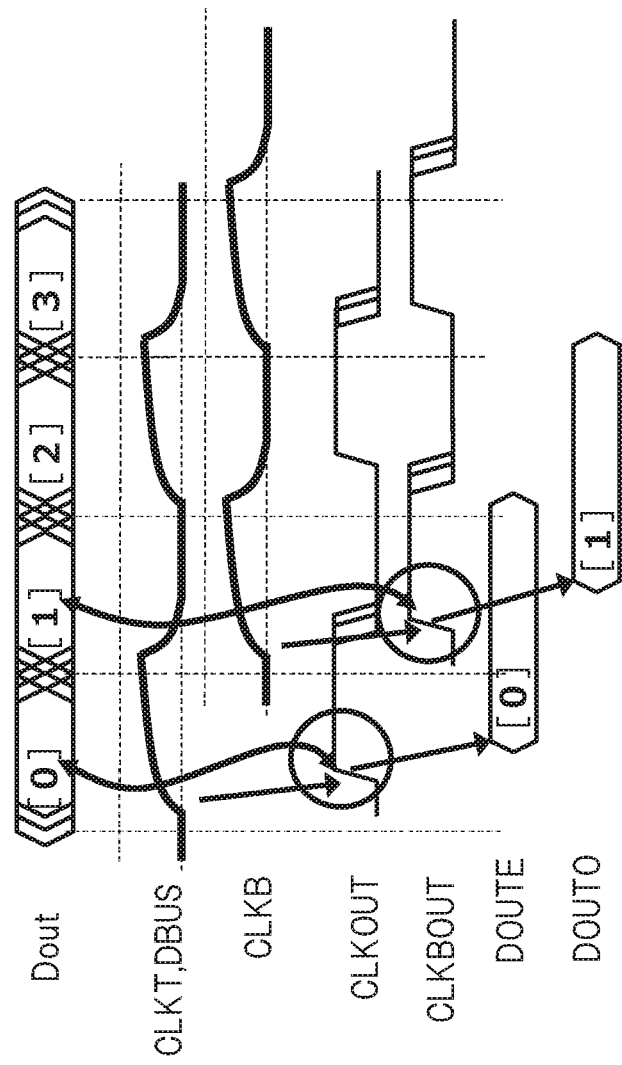
FIG. 2 is a waveform diagram of a signal generated by utilizing the first embodiment.

FIG. 2 is a waveform diagram of a signal using the first embodiment.

The even-numbered data Dout (0) that has been received first by the low-amplitude receiver circuit Rv is latched by the latch circuit DFF0 so as to be in synchronization with the rise edge of the non-inverted clock signal CLKOUT that has been received by the low-amplitude receiver circuit Rv. Next, the odd-numbered data Dout (1) that has been received first by the low-amplitude receiver circuit Rv is latched by the latch circuit DFF1 so as to be in synchronization with the rise edge of the inverted clock signal CLKBOUT that has been received by the low-amplitude receiver circuit Rv. As described above, subsequently, the even-numbered data Dout is output after being latched by the latch circuit DFF0 so as to be in synchronization with the rise edge of the non-inverted clock signal CLKOUT, and the odd-numbered data Dout is output after being latched by the latch circuit DFF1 so as to be in synchronization with the rise edge of the inverted clock signal CLKBOUT.

By using such a method, both the latch circuits DFF0 and DFF1 can latch the data in synchronization with the rise edges of the clock signals (CLKOUT and CLKBOUT) as different from the case of FIG. 27. In the manner, in comparison with the case of FIG. 27, the data window for use in correctly acquiring the data can be expanded. Besides, the variation in the data acquisition time can be suppressed. As a result, the reliability of the high-speed data transfer operation can be improved. Still further, since the signal having the low amplitude is used, the operating electric current on the signal bus can be reduced.

Second Embodiment

<<Details of Driver Circuit Unit (of Second Embodiment)>>

Figure 3:
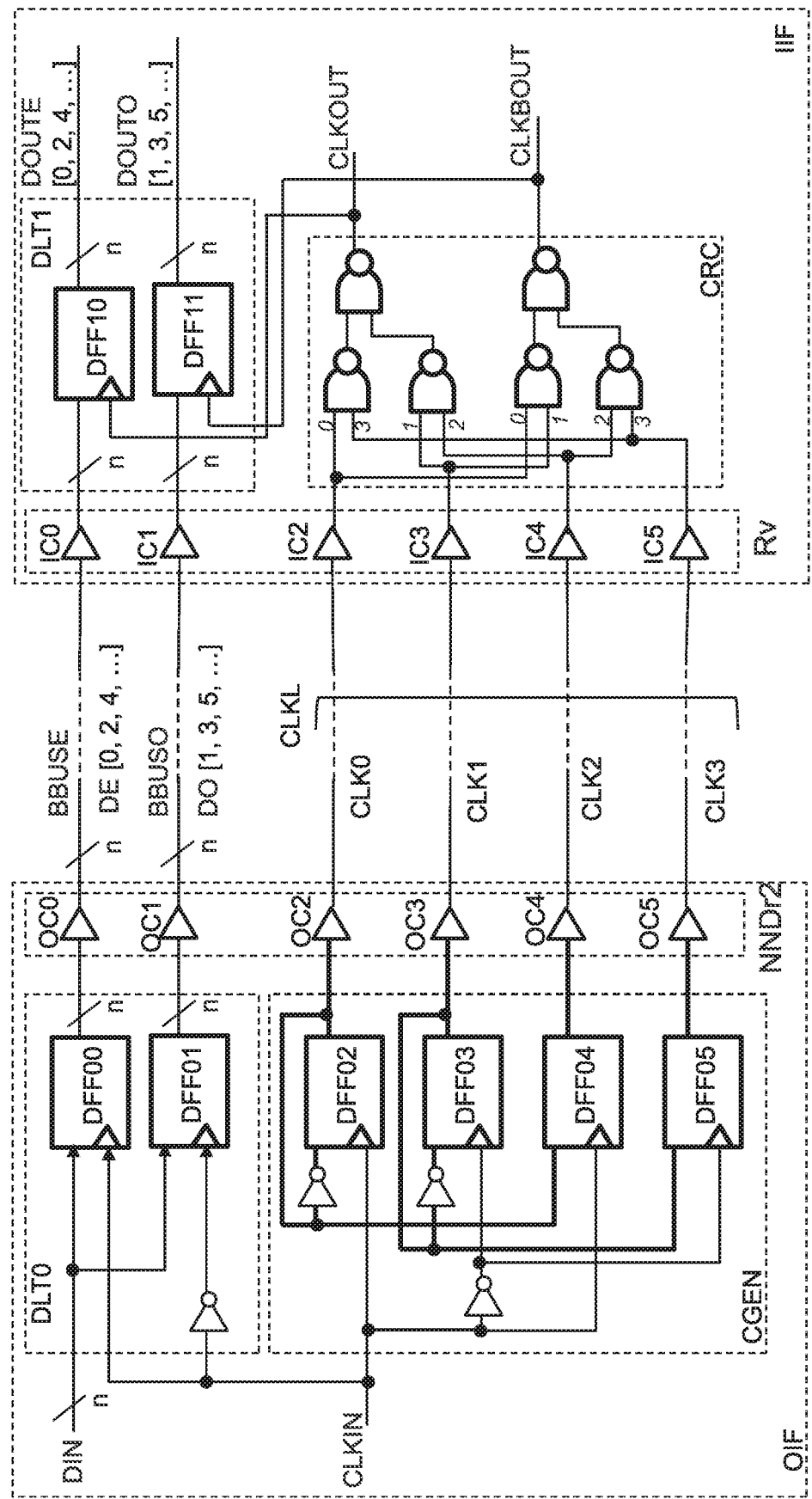
FIG. 3 is a data transfer diagram of a second embodiment.

FIG. 3 is a data transfer diagram of a second embodiment. In FIG. 3, the data is transferred while four-phase clock signals are used.

An output interface circuit OIF includes a data latch circuit DLT0, a four-phase clock generating circuit CGEN and a low-amplitude driver circuit NNDr2, and the n-bit data DIN and the clock signal CLKIN are supplied to this circuit.

The data latch circuit DLT0 includes latch circuits DFF00 and DFF01. The four-phase clock generating circuit CGEN includes latch circuits DFF02 to DFF05. The low-amplitude driver circuit NNDr2 includes output circuits OC0 to OC5, and the output circuits OC0 and OC1 are arranged so as to correspond to the number of "n" bits in order to input and output the n-bit data in parallel.

Each of the output circuits OC0 to OC5 has a circuit configuration shown in FIG. 28, and outputs a signal having an amplitude that is lower by Vth of the N-type MOSFET 1 than the voltage amplitude of the input signal.

The non-inverted clock signal is supplied to the latch circuits DFF00, DFF02 and DFF04, and the inverted clock signal is supplied to the latch circuits DFF01, DFF03 and DFF05.

The latch circuit DFF00 latches the even-numbered data DIN (0, 2, 4, . . . ) in synchronization with the non-inverted clock signal, and outputs the latched data to the output circuit OC0. The latch circuit DFF01 latches the odd-numbered data DIN (1, 3, 5, . . . ) in synchronization with the inverted clock signal, and outputs the latched data to the output circuit OC1.

The output signals of the latch circuits DFF02 and DFF03 are fed back to inputs of these respective latch circuits, and besides, the signals that are inverted by the inverter circuits are input to these latch circuits. To the latch circuit DFF04, an output signal of the latch circuit DFF02 is fed back as its input signal. To the latch circuit DFF05, an output signal of the latch circuit DFF03 is fed back as its input signal.

The latch circuit DFF02 outputs a clock signal CLK0, and the latch circuit DFF03 outputs a clock signal CLK1, a phase of which shifts by 90° from that of the clock signal CLK0. The latch circuit DFF04 outputs a clock signal CLK2, a phase of which shifts by 180° from that of the clock signal CLK0, and the latch circuit DFF05 outputs a clock signal CLK3, a phase of which shifts by 270° from that of the clock signal CLK0.

The low-amplitude driver circuit NNDr2 outputs the even-numbered data DE (0, 2, 4, . . . ) to an even-numbered data bus BBUSE having an "n" bit width, and outputs the odd-numbered data DO (1, 3, 5, . . . ) to an odd-numbered data bus BBUSO having an "n" bit width. The low-amplitude driver circuit NNDr2 outputs the clock signals CLK0 to CLK3 to the clock signal line CLKL.

An input interface circuit IIF includes a data latch circuit DLT1, a clock recovery circuit CRC and the low-amplitude receiver circuit Rv, and each signal from the even-numbered data bus BBUSE, the odd-numbered data bus BBUSO and the clock signal line CLKL is supplied to this input interface circuit.

The low-amplitude receiver circuit Rv includes input circuits IC0 to IC5. To the data latch circuit DLT1, the input circuit IC0 outputs the even-numbered data, and the input circuit IC1 outputs the odd-numbered data. Each of the input circuits IC2 to IC5 outputs each clock signal to the clock recovery circuit CRC.

The input circuits IC0 and IC1 are arranged so as to correspond to the number of "n" bits in order to input and output the n-bit data in parallel.

The clock recovery circuit CRC is made of a plurality of NAND logic circuits, and generates two-phase clock signals from the input four-phase clock signals, the two-phase clock signals being made of the clock signal CLKOUT and the clock signal CLKBOUT that is the inverted signal of the clock signal CLKOUT, and outputs the two-phase clock signals.

The data latch circuit DLT1 includes latch circuits DFF10 and DFF11. The latch circuit DFF10 latches the even-numbered data in synchronization with the rise edge of the clock signal CLKOUT, and outputs the latched data. The latch circuit DFF11 latches the odd-numbered data in synchronization with the rise edge of the clock signal CLKBOUT, and outputs the latched data.

Each circuit shown in FIG. 3 is included in the driver circuit unit DrU shown in FIGS. 21, 22, 23 and 24.

Figure 4:
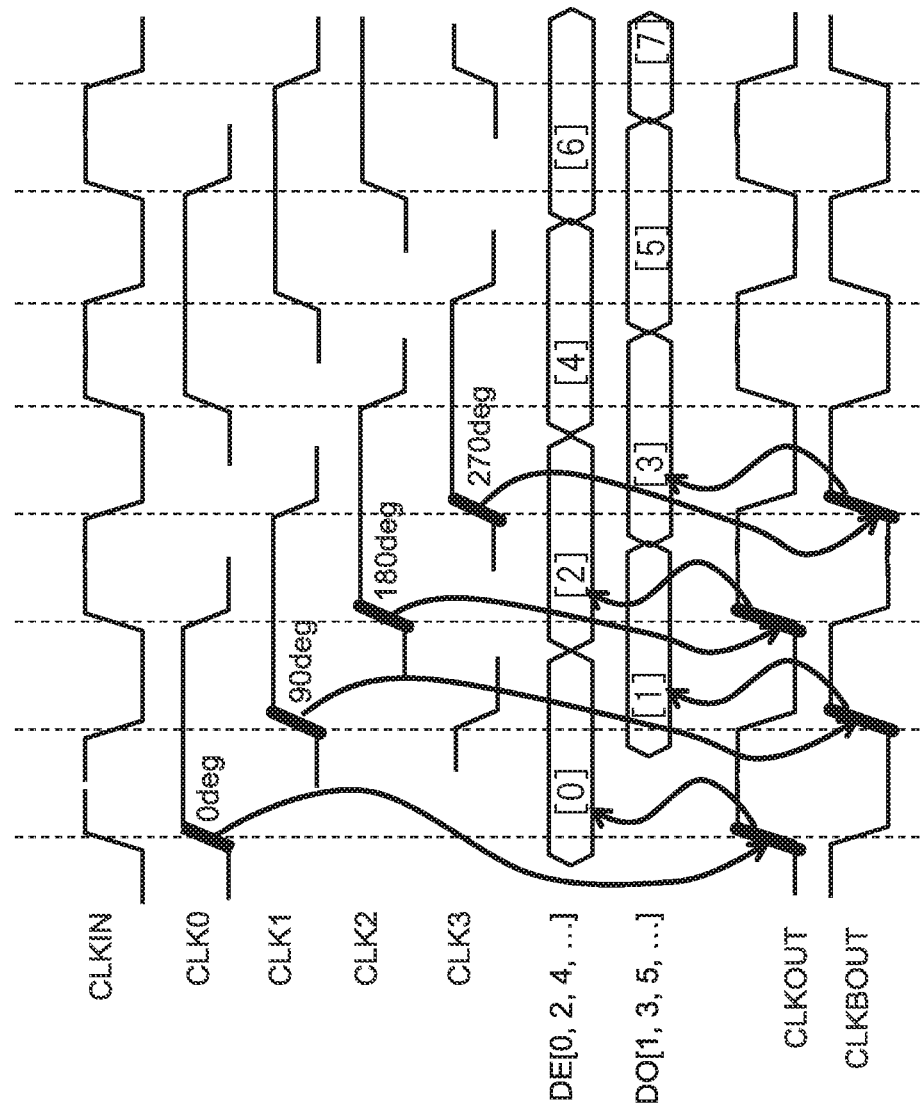
FIG. 4 is a diagram showing a data transfer waveform generated when four-phase clock signals are used.

FIG. 4 is a diagram showing a waveform of data transfer obtained when the four-phase clock signals are used.

By the four-clock generating circuit CGEN, the four-phase clock signals CLK0 to CLK3 are generated from the clock signal CLKIN.

To the input interface circuit IIF, the even-numbered data DE is supplied through an even-numbered-data bus BBUSE, and the odd-numbered data DO is supplied through an odd-numbered-data bus BBUSO.

The data DE and the data DC that have been supplied through the even-numbered-data bus BBUSE and the odd-numbered-data bus BBUSO are sequentially latched by the latch circuits DFF10 and DFF11 in synchronization with the respective rise edges of the two-phase clock signals CLKOUT and CLKBOUT that have been recovered from the four-phase clock signals CLK0 to CLK3.

In this data transfer method, a peak electric current in the bus driving is distributed, and power supply noise is reduced, and therefore, deterioration in high-frequency transfer characteristics due to the power supply noise is improved.

Third Embodiment

<<Details of Driver Circuit Unit (of Third Embodiment)>>

Figure 5:
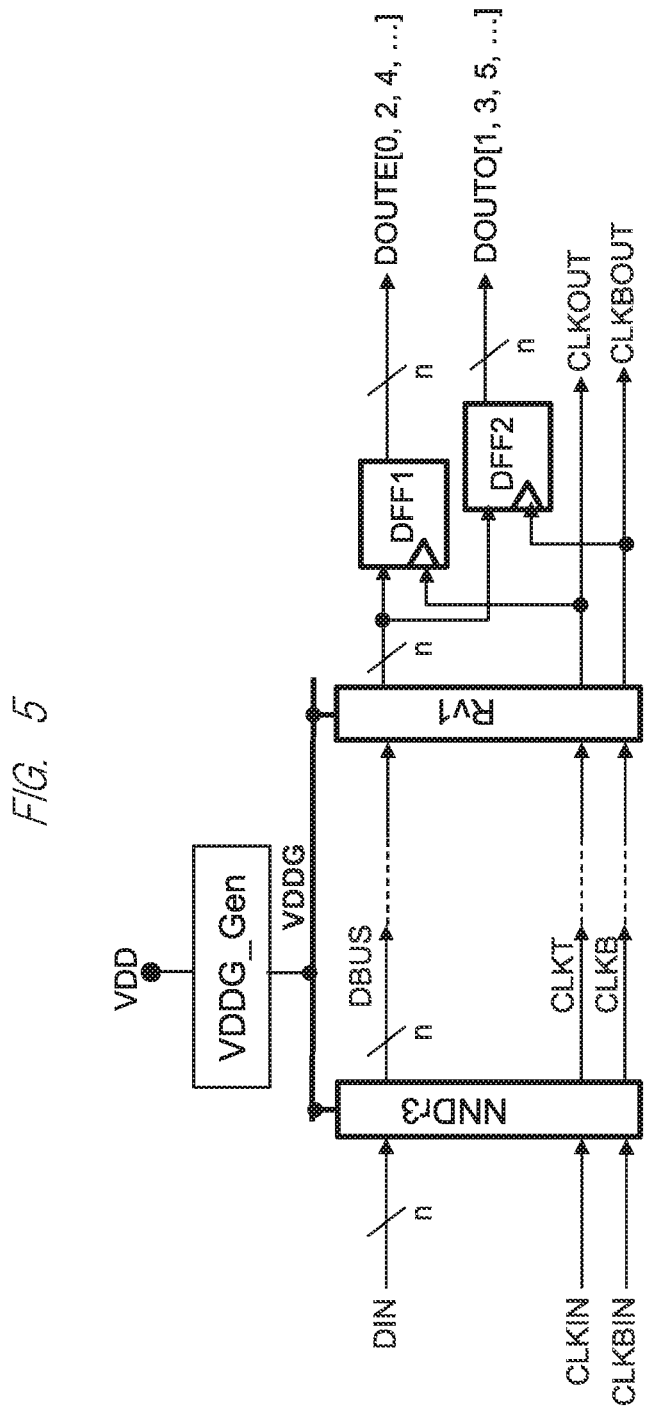
FIG. 5 is a data transfer diagram showing signal transfer at a low amplitude by using a low-voltage power supply circuit in a third embodiment.

FIG. 5 is a data transfer diagram showing signal transfer at a low amplitude using a low-voltage power supply circuit in a third embodiment. The power supply voltage VDD (of, for example, 1.0 V) is applied to a low-voltage power supply circuit VDDG_Gen, so that a low voltage VDDG (of, for example, 0.5 V) is generated. The low voltage VDDG is supplied to a low-amplitude driver circuit NNDr3 and a low-amplitude receiver circuit Rv1.

The low-amplitude driver circuit NNDr3, the low-amplitude receiver circuit Rv1 and the low-voltage power supply circuit VDD_Gen are included in the driver circuit unit DrU shown in FIGS. 21, 22, 23 and 24.

Figure 6:
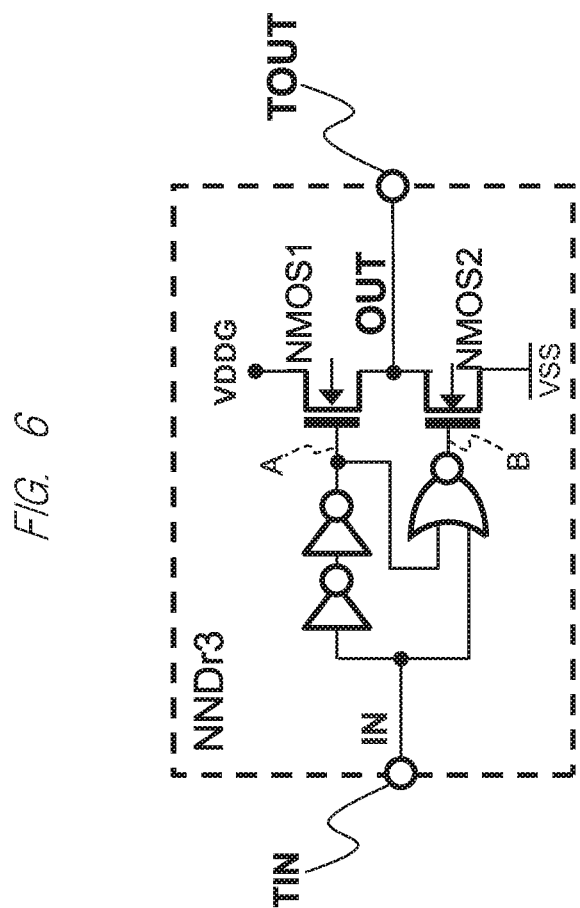
FIG. 6 is a circuit diagram of a low-amplitude driver circuit to which a low voltage is applied.

FIG. 6 shows a circuit diagram of the low-amplitude driver circuit to which the low voltage is applied. The low voltage VDDG that has been generated from the low-voltage power supply VDDG_Gen is supplied to a drain of the N-type MOSFET 1. When the input signal IN having the high level is supplied from the input terminal TIN, a level of a gate node A of the N-type MOSFET 1 becomes high level, and a level of a gate node B of the N-type MOSFET 2 becomes low level. In this case, the N-type MOSFET 1 is turned ON, so that the low voltage VDDG that is lower than the voltage in the case of FIG. 28 (such as the voltage that is lower by the Vth of the N-type MOSFET 1 than the power supply voltage VDD) is output to the output terminal TOUT.

The input signal IN is the data DIN or the clock signals CLKIN and CLKBIN shown in FIG. 5.

Figure 7:
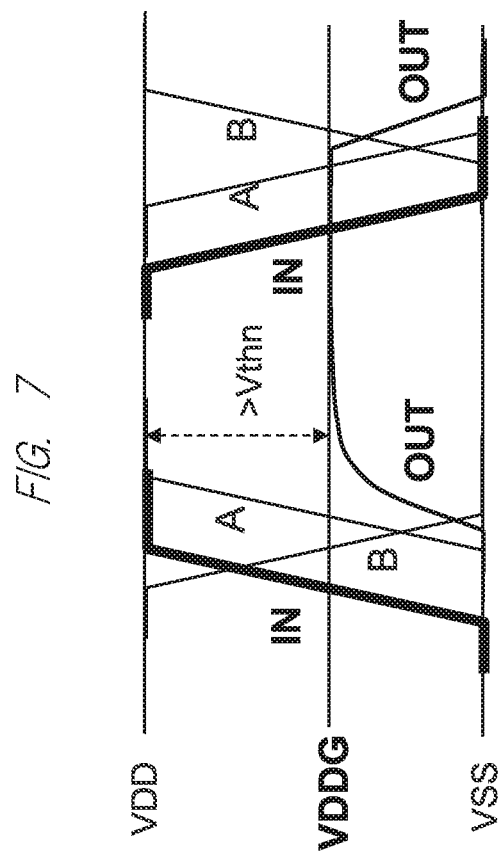
FIG. 7 is an operational waveform diagram of the low-amplitude driver circuit of FIG. 6.

FIG. 7 is a diagram showing an operating waveform of the low-amplitude driver circuit of FIG. 6.

When the level of the input signal IN of the low-amplitude driver circuit NNDr3 changes from the low level (VSS) to the high level (VDD), the level of the gate potential A of the N-type MOSFET 1 becomes the high level (VDD) to turn ON the N-type MOSFET 1, and the level of the gate potential B of the N-type MOSFET 2 becomes the low level (VSS) to turn OFF the N-type MOSFET 2. In this case, the low voltage VDDG is output as the output signal OUT to the output terminal TOUT through the N-type MOSFET 1.

When the level of the input signal IN of the low-amplitude driver circuit NNDr3 changes from the high level (VDD) to the low level (VSS), the level of the gate potential A of the N-type MOSFET 1 becomes the low level (VSS) to turn OFF the N-type MOSFET 1, and the level of the gate potential B of the N-type MOSFET 2 becomes the high level (VDD) to turn ON the N-type MOSFET 2. In this case, the ground potential VSS is output as the output signal OUT to the output terminal TOUT.

When the low-amplitude driver circuit NNDr3 outputs the high-level signal as described above, the level of the output signal OUT becomes the low voltage VDDG that is lower than the "VDD-Vth". In the manner, the voltage of the output signal OUT can be prevented from increasing until the low-amplitude driver circuit NNDr3 (N-type MOSFET 1) is almost turned OFF, and therefore, a cause of the variation in the dependence of the high level of the low-amplitude driver circuit NNDr3 on the output rate (such as cycle dependence) can be reduced.

Further, the signal amplitude of the bus signal system can be made lower by the low voltage VDDG, and therefore, the larger effect of the power reduction can be obtained.

Fourth Embodiment

<<Details of Driver Circuit Unit (of Fourth Embodiment)>>

Figure 8:
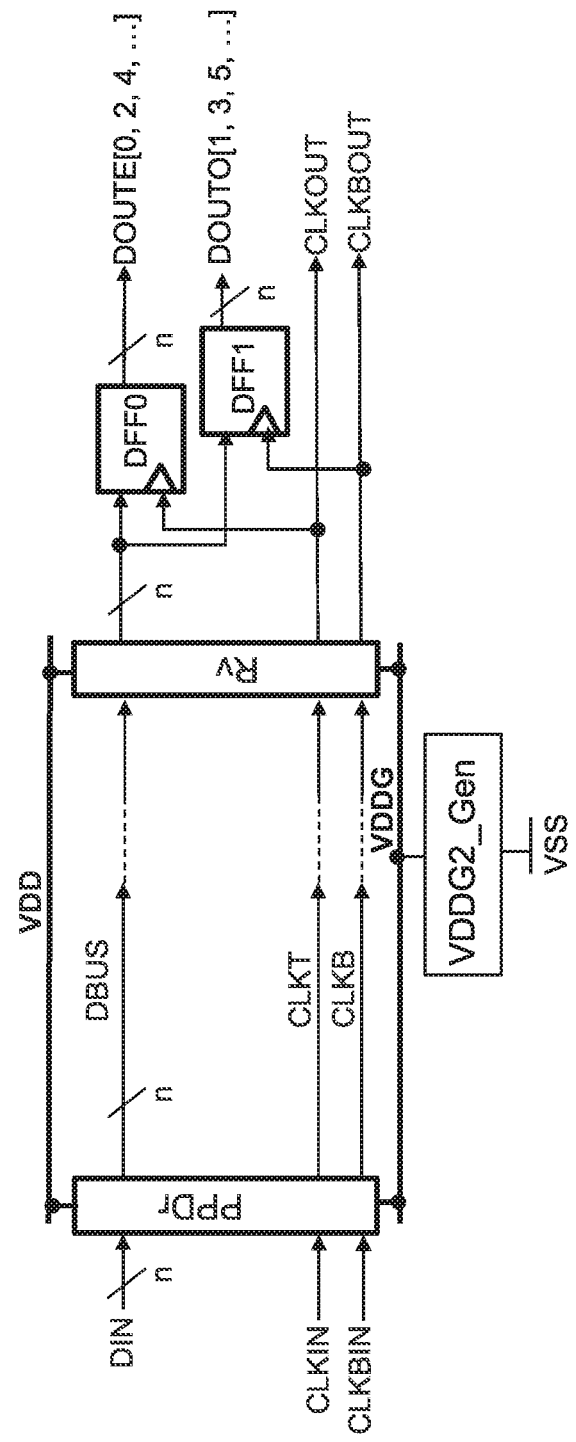
FIG. 8 is a data transfer diagram generated when a P-type MOSFET is used for an output circuit in a fourth embodiment.

FIG. 8 is a data transfer diagram obtained when a P-type MOSFET is used for the output circuit in a fourth embodiment.

To a low-amplitude driver circuit PPDr and the low-amplitude receiver circuit Rv, the power supply voltage VDD and the low voltage VDDG (0.5 V) are applied as the respective operational voltages. The low voltage VDDG is generated by a low-voltage generating circuit VDDG2_Gen that is connected to the ground potential VSS.

The low-amplitude driver circuit PPDr, the low-amplitude receiver circuit Rv and the low-voltage power supply circuit VDD2_Gen are included in the driver circuit unit DrU shown in FIGS. 21, 22, 23 and 24.

Figure 9:
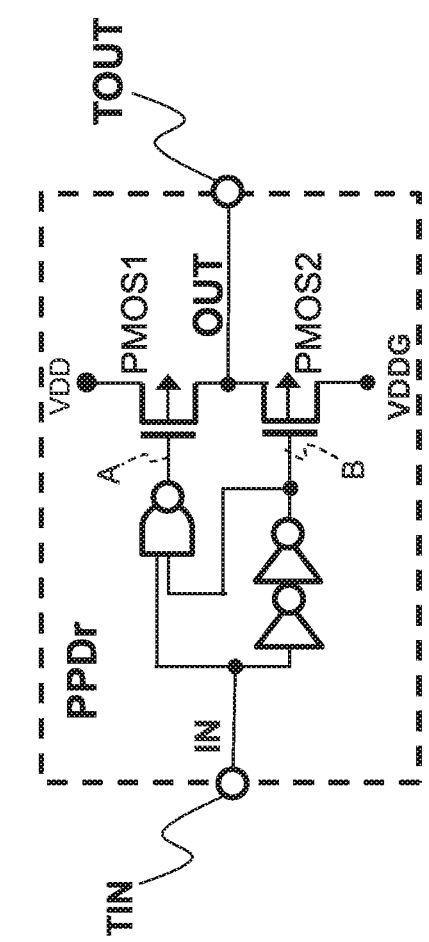
FIG. 9 is an output circuit diagram of a low-amplitude driver circuit using a P-type MOSFET.

FIG. 9 is an output circuit diagram of the low-amplitude driver circuit using the P-type MOSFET.

The low-amplitude driver circuit PPDr takes input of the input signal IN from the input terminal TIN when the power supply voltage VDD and the low voltage VDDG are supplied thereto as the operational power supply, and outputs the output signal OUT from the output terminal TOUT.

The P-type MOSFETS 1 and 2 are connected to each other in series, the power supply voltage VDD (1.0 V) is applied to a source of the P-type MOSFET 1, the input signal IN from the input terminal TIN is supplied to a gate thereof, and a drain thereof is connected to the output terminal TOUT. The VDDG is applied to a drain of the P-type MOSFET 2, the inverted signal of the input signal IN from the input terminal TIN is supplied to a gate thereof, and a source thereof is connected to the output terminal TOUT.

When the input signal IN having the high level is supplied, the P-type MOSFET 1 is turned ON, so that the signal of the low voltage VDD is output as the output signal OUT to the output terminal TOUT.

When the input signal IN having the low level is supplied, the P-type MOSFET 2 is turned ON, so that the low voltage VDDG is output as the output signal OUT to the output terminal TOUT.

In other words, the output voltage of the output circuit made of the P-type MOSFET has the amplitude swinging between the power supply voltage VDD and the low voltage VDDG. In the manner, the signal amplitude to be output is reduced as similar to that of the output circuit of the low-amplitude driver circuit using the N-type MOSFET. Therefore, the increasing charge/discharge electric current on a load capacitance becomes lower as the wiring of the data bus DBUS becomes longer, so that the driving electric current of the data bus DBUS can be reduced.

The input signal IN is the data DIN or the clock signals CLKIN and CLKBIN.

Figure 10:
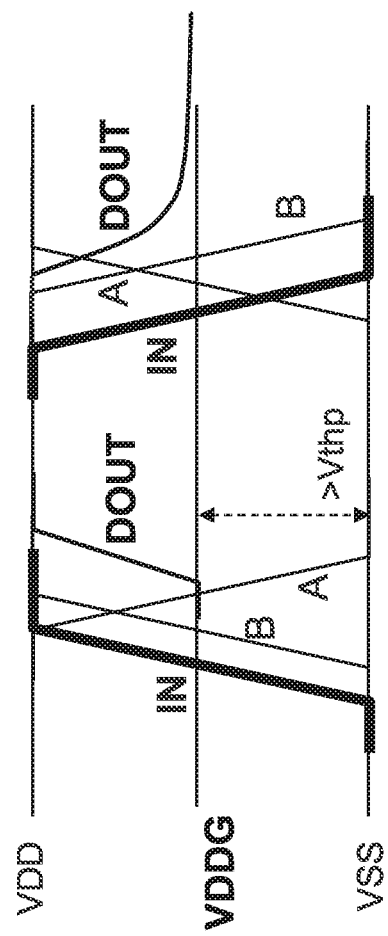
FIG. 10 is an operational waveform diagram of the low-amplitude driver circuit of FIG. 9.

FIG. 10 is an operating waveform diagram of the low-amplitude driver circuit of FIG. 9.

The level of the input signal IN changes from the low level (VSS) to the high level (VDD), a level of the potential A of the gate of the p-type MOSFET 1 becomes the low level (VSS) to turn ON the P-type MOSFET 1, and a level of the potential B of the gate of the P-type MOSFET 2 becomes the high level (VDD) to turn OFF the P-type MOSFET 2. At this moment, the voltage of the output signal OUT of the output terminal TOUT changes from the low voltage VDDG to the power supply voltage VDD through the P-type MOSFET 1.

The level of the input signal IN changes from the high level (VDD) to the low level (VSS), a level of the potential A of the gate of the P-type MOSFET 1 becomes the high level (VDD) to turn OFF the P-type MOSFET 1, and a level of the potential B of the gate of the P-type MOSFET 2 becomes the low level (VSS) to turn ON the P-type MOSFET 2. At this moment, the low voltage VDDG is output as the output signal OUT to the output terminal TOUT.

When the low level of the output voltage increases by the Vth of the PMOS as described above, the amplitude of the signal to be transferred on the long wiring is lowered.

The operating waveform of the output circuit of the low-amplitude driver circuit using the P-type MOSFET is as a waveform obtained by inverting the voltage relation between the high level and the low level of the output circuit of the low-amplitude driver circuit using the N-type MOSFET. In other words, in the low-amplitude driver circuit using the P-type MOSFET, the usage of the fall edge of the clock signal is the countermeasure for improving the accuracy in the high-speed operation.

When the low voltage VDDG is higher than the threshold value Vth of the P-type MOSFET, this can be used as a low-power data transfer circuit that is effective for, for example, preventing noise propagation from a common GND power supply to an adjacent analog circuit or others.

Fifth Embodiment

Figure 11:
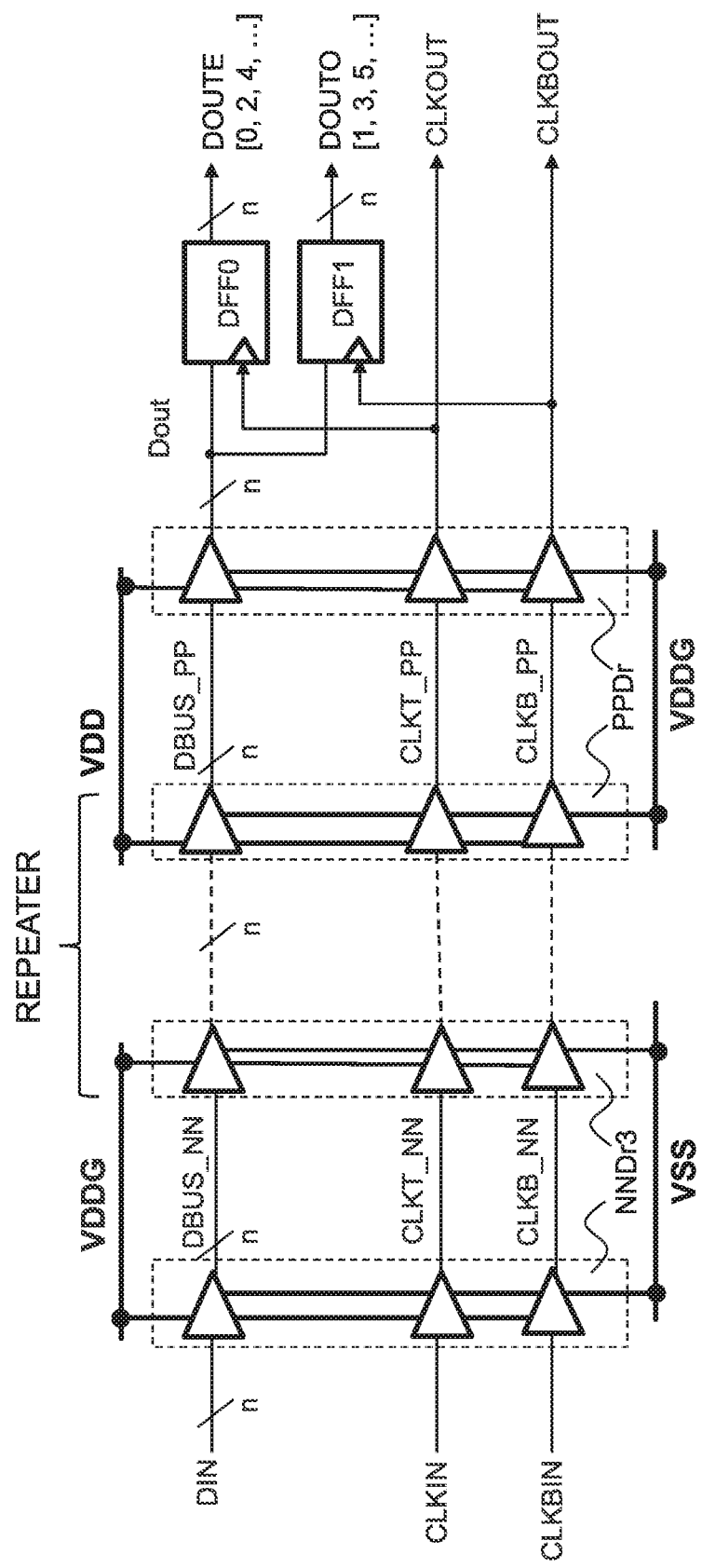
FIG. 11 is a diagram of a low-amplitude data bus in combination use of the driver circuits of FIGS. 6 and 9 in a fifth embodiment.

FIG. 11 is a diagram of a low-amplitude data bus in combination use of the driver circuits of FIGS. 6 and 9 in a fifth embodiment.

FIG. 11 shows a configuration in a case of the transfer of the signal having the low amplitude on the long wiring, the configuration being in combination use of the low-amplitude driver circuit NNDr3 using the N-type MOSFET and the low-amplitude driver circuit PPDr using the P-type MOSFET that function as low-amplitude driving systems ahead of and behind a repeater that is arranged in the middle of the wiring.

The operational power supply of the low-amplitude driver circuit NNDr3 is the low voltage VDDG and the ground voltage VSS, and the operational power supply of the low-amplitude driver circuit PPDr is the power supply voltage VDD and the low voltage VDDG. The low voltage VDDG is generated by an internal power supply generating circuit, and is set to be about ½ times the power supply voltage VDD as a common power supply potential between the low-amplitude driver circuits NNDr3 and PPDr.

Each circuit shown in FIG. 11 is included in the driver circuit unit DrU shown in FIGS. 21, 22, 23 and 24.

Figure 12:
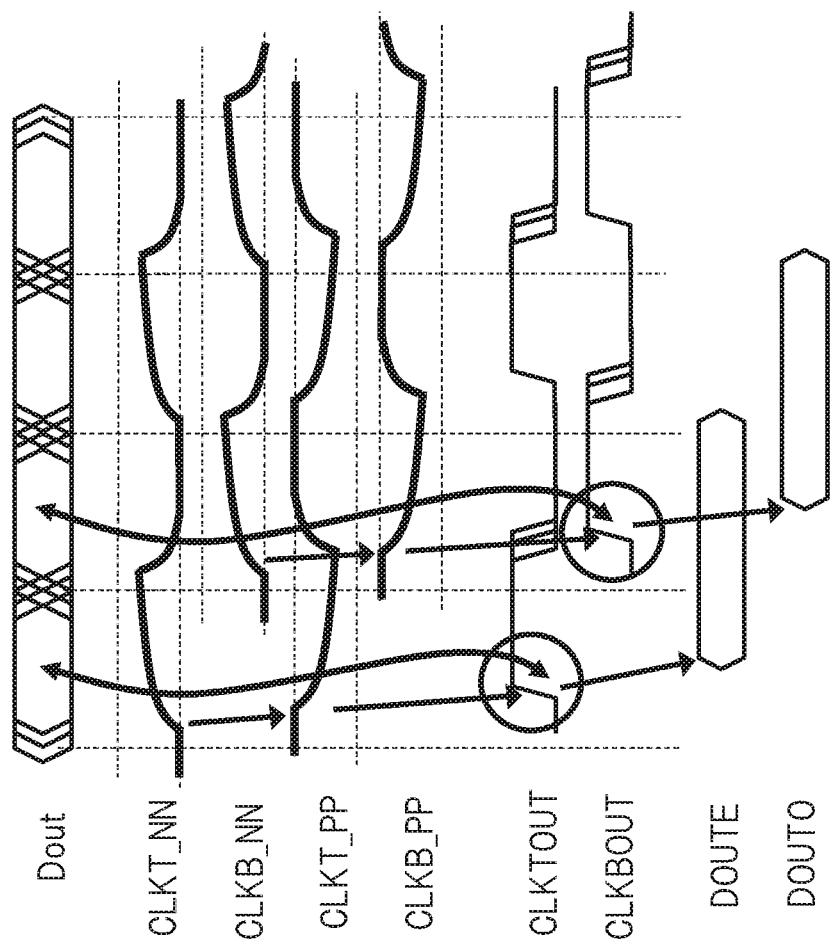
FIG. 12 is a diagram showing an operational waveform at the time of data transfer in the low-amplitude data bus of FIG. 11.

FIG. 12 is a diagram showing an operating waveform at the time of the data transfer in the low-amplitude data bus of FIG. 11.

As seen from FIG. 12, rise edges of a non-inverted clock signal CLKT_NN and an inverted clock signal CLKB_NN are synchronized in the low-amplitude driver circuit NNDr3, and fall edges of a non-inverted clock signal CLKT_PP and an inverted clock signal CLKB_PP are synchronized in the low-amplitude driver circuit PPDr. Therefore, the accuracies of the transfer and the latch of the signal in synchronization with the clock signals are improved.

Figure 13:
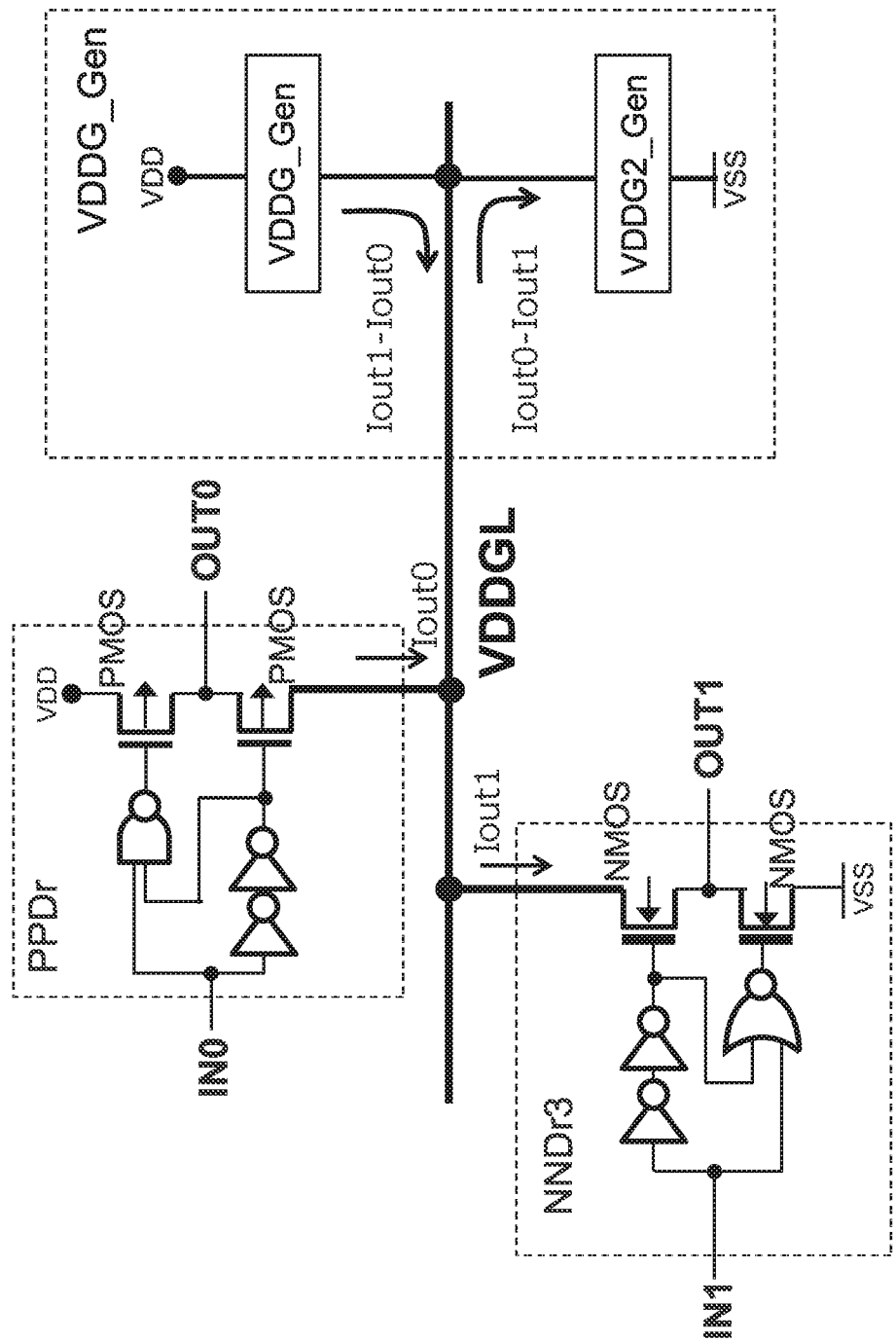
FIG. 13 is a configurational diagram of a common power supply between low-amplitude driver circuits NNDr and PPDr.

FIG. 13 is a configurational diagram of a common power supply between the low-amplitude driver circuits NNDr3 and PPDr.

Since the low voltage VDDG is supplied in common to the low-amplitude driver circuits NNDr3 and PPDr through a power supply line VDDGL as their operational power supply as shown in FIG. 11, the discharge electric current (Iout0) of the low-amplitude driver circuit PPDr is flown into the power supply line VDDGL but is simultaneously also flown out as the charge electric current (Iout1) on the driver circuit side of the low-amplitude driver circuit NNDr3, and therefore, charge reuse effect is generated. Thus, effect for the significant consumed power reduction down to about ½ times those of the first to fourth embodiments can be expected.

The low-amplitude driver circuit NNDr3, the low-amplitude driver circuit PPDr and the low-voltage power supply circuit VDD_Gen are included in the driver circuit unit DrU shown in FIGS. 21, 22, 23 and 24.

Each of FIGS. 14 to 17 is a diagram showing another modification example in combination use of the low-amplitude driver circuit. NNDr/low-amplitude receiver circuit NNRv and the low-amplitude driver circuit PPDr/low-amplitude receiver circuit PPRv.

Figure 14:
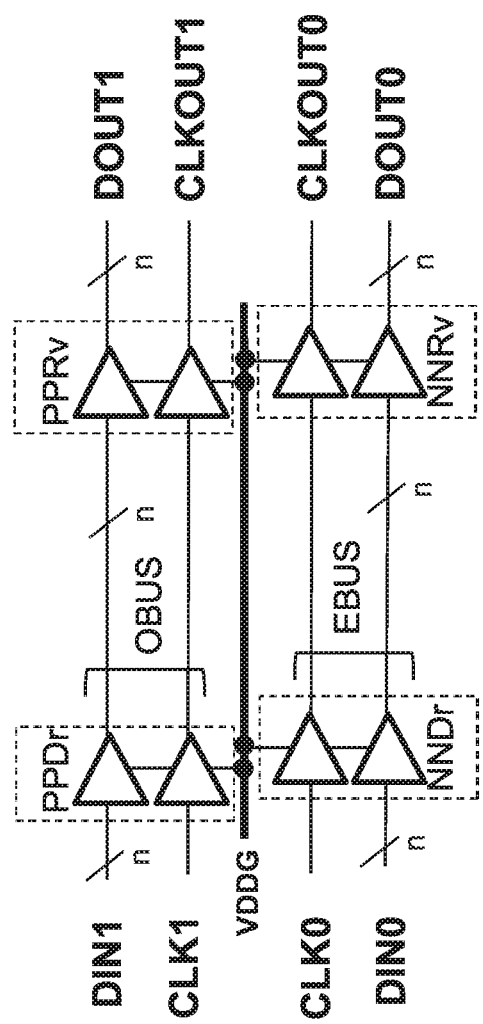
FIG. 14 is a diagram showing another modification example in combination use of the low-amplitude driver circuit NNDr/low-amplitude receiver circuit Rv and the low-amplitude driver circuit PPDr/low-amplitude receiver circuit Rv.
Figure 15:
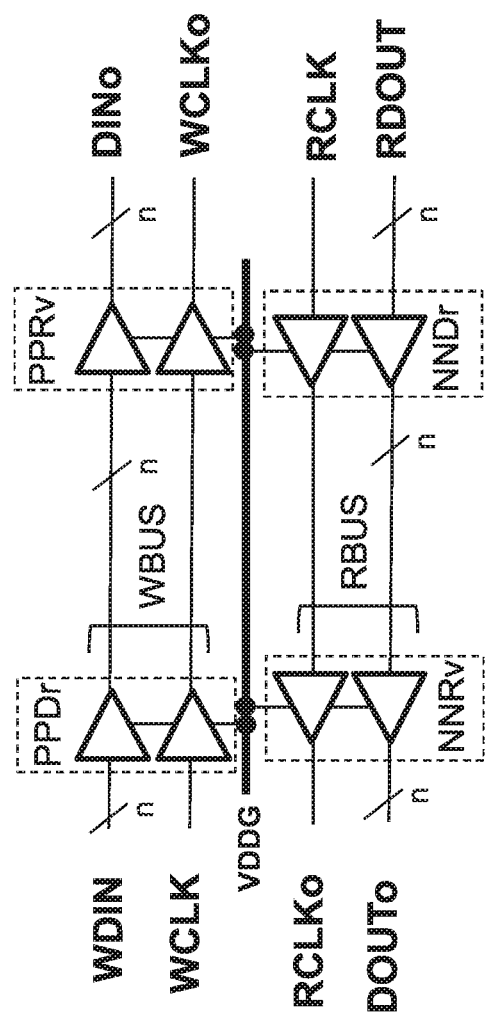
FIG. 15 is a diagram showing still another modification example in combination use of the low-amplitude driver circuit NNDr/low-amplitude receiver circuit Rv and the low-amplitude driver circuit PPDr/low-amplitude receiver circuit Rv.
Figure 16:
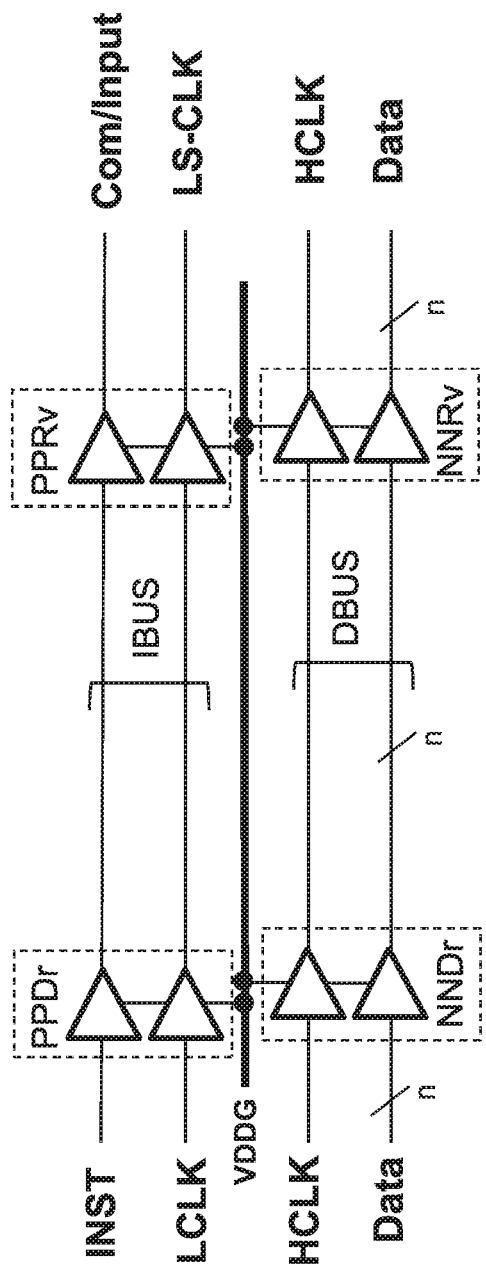
FIG. 16 is a diagram showing still another modification example in combination use of the low-amplitude driver circuit NNDr/low-amplitude receiver circuit Rv and the low-amplitude driver circuit PPDr/low-amplitude receiver circuit Rv.
Figure 17:
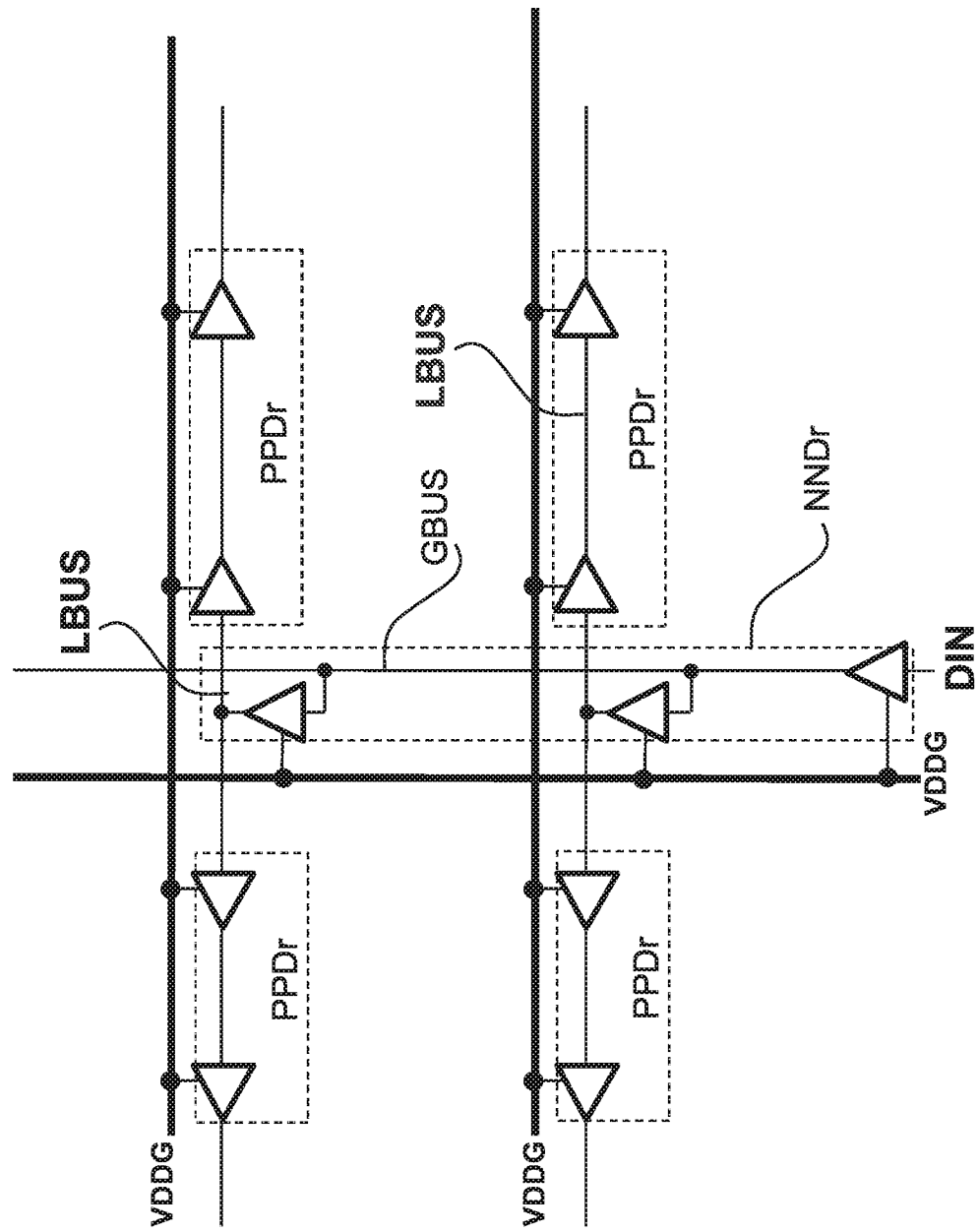
FIG. 17 is a diagram showing still another modification example in combination use of the low-amplitude driver circuit NNDr/low-amplitude receiver circuit Rv and the low-amplitude driver circuit PPDr/low-amplitude receiver circuit Rv.

The low-amplitude driver circuit NNDr, the low-amplitude receiver circuit NNRv, the low-amplitude driver circuit PPDr and the low-amplitude receiver circuit PPRv of FIGS. 14 to 16 are included in the driver circuit unit DrU shown in FIGS. 21, 22, 23 and 24. The low-amplitude driver circuit NNDr of FIG. 17 is included in the driver circuit unit DrU shown in FIGS. 22 and 24, and the low-amplitude driver circuit PPDr is included in a memory array MA.

FIG. 14 shows a first modification example. FIG. 14 shows an example of a case of division of the n-bit data into two groups of the odd-numbered data and the even-numbered data.

The odd-numbered data DIN1 and the odd-numbered-data clock signal CLK1 are output onto an odd-numbered-data bus OBUS by the low-amplitude driver circuit PPDr including the output circuit made of the P-type MOSFET, and are taken into the low-amplitude receiver circuit PPRv including the output circuit made of the P-type MOSFET.

The even-numbered data DIN0 and the even-numbered-data clock signal CLK0 are output onto an even-numbered-data bus EBUS by the low-amplitude driver circuit NNDr including the output circuit made of the N-type MOSFET, and are taken into the low-amplitude receiver circuit NNRv including the output circuit made of the N-type MOSFET.

FIG. 15 shows a second modification example. FIG. 15 shows an example of a case of division of the n-bit data into two groups based on a signal transmission direction (purpose).

A writing data WDIN and a writing-data clock signal WCLK are output onto a writing-data bus WBUS by the low-amplitude driver circuit PPDr including the output circuit made of the P-type MOSFET, and are taken into the low-amplitude receiver circuit PPRv including the output circuit made of the P-type MOSFET.

A reading data RDOUT and a reading-data clock signal RCLK are output onto a reading-data bus RBUS by the low-amplitude driver circuit NNDr including the output circuit made of the N-type MOSFET, and are taken into the low-amplitude receiver circuit NNRv including the output circuit made of the N-type MOSFET.

FIG. 16 shows a third modification example. FIG. 16 shows an example of a case of division of the n-bit data into two groups based on an operational frequency.

A low-frequency clock signal LCLK and an instruction INST are received by the low-amplitude driver circuit PPDr including the output circuit made of the P-type MOSFET, and are output to an instruction bus IBUS.

A high-frequency clock signal HCLK and data Data are received by the low-amplitude driver circuit NNDr including the output circuit made of the N-type MOSFET, and are output to a data bus DBUS.

A frequency of the low-frequency clock signal is several hundred MHz (for example, 200 MHz), and a frequency of the high-frequency clock signal is several GHz (for example, 1 GHz or larger).

FIG. 17 shows a fourth modification example. FIG. 17 shows an example of a case of division of the n-bit data into two groups based on, for example, a hierarchical bus system in the memory.

The data DIN that has been input through a global bus GBUS is received by the low-amplitude driver circuit NNDr including the output circuit made of the N-type MOSFET, and is output to a local bus LBUS.

The data DIN that has been input through the local bus LBUS is received by the low-amplitude driver circuit PPDr including the output circuit made of the P-type MOSFET, and is output to the local bus LBUS.

For example, the global bus GBUS is made of a metal material such as aluminum, and the local bus LBUS is made of silicon that is a different material from the metal material.

Figure 18:
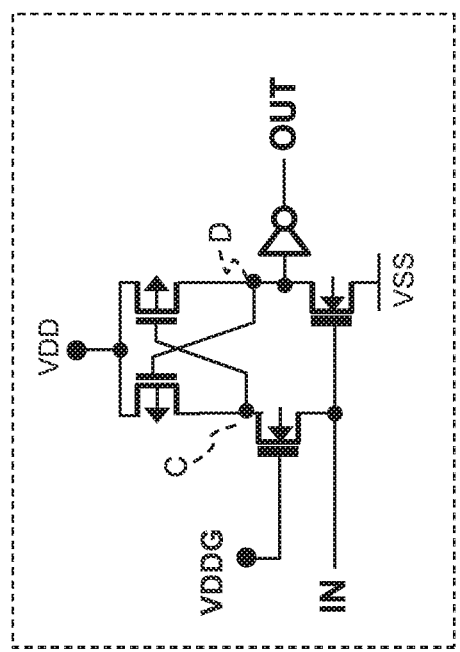
FIG. 18 is a circuit diagram of a low-amplitude receiver circuit.
Figure 19:
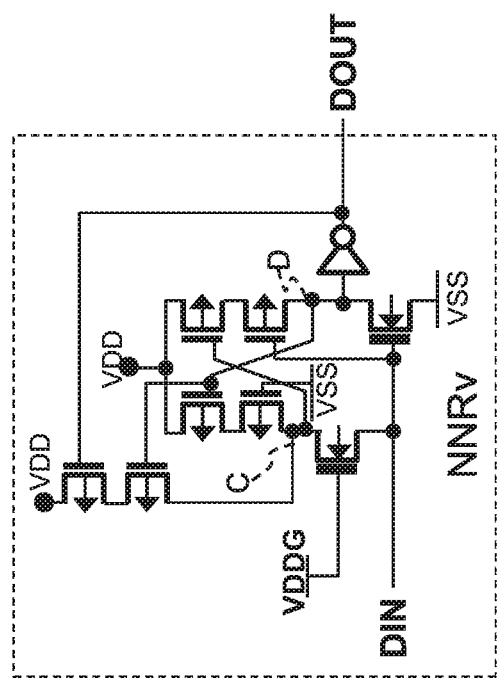
FIG. 19 is a circuit diagram of a low-amplitude receiver circuit.
Figure 20:
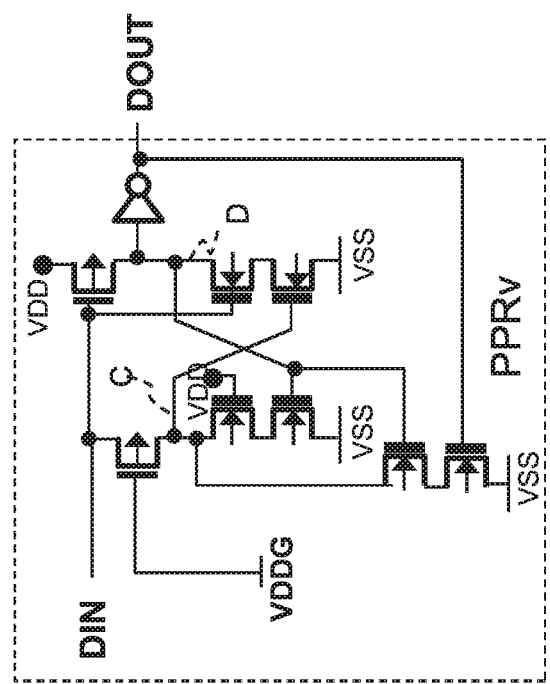
FIG. 20 is a circuit diagram of a low-amplitude receiver circuit.

Each of FIGS. 18 to 20 is a circuit diagram of the low-amplitude receiver circuit.

FIG. 18 shows an ordinary level shifter circuit. This circuit is supplied with the power supply voltage VDD and the ground potential VSS as its operational voltage, and receives the low voltage VDDG as the input signal IN that is lower than the power supply voltage VDD. The input signal IN is the data or the clock signal, and data and a clock signal having a larger voltage amplitude than that of the input signal IN are output as the output signal. OUT.

FIG. 19 shows a first receiver circuit having a further improved performance of FIG. 18, and FIG. 20 shows a second receiver circuit having a further improved performance of FIG. 18.

When high-speed receiver circuits each having an actively-improved performance ratio of the PMOS or NMOS at an internal connecting point C or D of the low-amplitude receiver circuit NNRv or PPRv are used for the low-amplitude receiver circuits NNRv and PPRv, the signal propagation delay due to the low amplitude is improved. This also means that the output waveform of the receiver circuit becomes sharper, which results in the improvement of the H/L data difference generated in the receiver circuit. Therefore, the variation accuracy of the control clock transfer and the data-taking accuracy in the data transfer can be comprehensively improved.

The explanation for the embodiments has described that the data and the clock signal are transferred at the low amplitude. However, not only the data and the clock signal but also not-illustrated address signal and control signal such as RAS and CAS are also transferred at a low amplitude.

In the foregoing, the present invention has been described on the basis of the embodiments. However, it is needless to say that the present invention is not limited to the configurations of the foregoing embodiments and includes various modifications and alterations that can be made within the scope of the present invention by those who are skilled in the art.

What is claimed is:

1. A semiconductor system comprising:
a semiconductor device having a central processor unit and a logic circuit that are formed on one semiconductor chip; and
a memory device that is formed on the one semiconductor chip,
wherein each of the semiconductor device and the memory device includes:
a driver circuit; and
a receiver circuit,
wherein the driver circuit of the semiconductor device is coupled to the receiver circuit of the memory device,
wherein the driver circuit of the memory device is coupled to the receiver circuit of the semiconductor device,
wherein a first power supply voltage is applied to each of the driver circuits,
wherein each of the driver circuits outputs to the corresponding receiver circuit (1) data, (2) a first clock signal, and (3) a second clock signal,
wherein a phase of the second clock signal is shifted by a predetermined amount from the first clock signal,
wherein each amplitude of (1) the data, (2) the first clock signal, and (3) the second clock signal is smaller than an amplitude of the first power supply voltage, and
wherein the semiconductor device and the memory device input the data in synchronization with rise edges of the first and second clock signals.

2. The semiconductor system according to claim 1, wherein the driver circuit includes:
an output terminal; and
an output circuit including first and second N-type MOSFETs,
wherein the first power supply voltage is applied to a first electrode of the first N-type MOSFET,
wherein a ground voltage is applied to a first electrode of the second N-type MOSFET, and
wherein a second electrode of each of the first and second N-type MOSFETs is connected to the output terminal.

3. The semiconductor system according to claim 2, wherein the output circuit includes:
a data output circuit configured to output the data; and
a clock output circuit configured to output the first and second clock signals,
wherein the data output circuit is connected to the receiver circuit through a data signal line, and
wherein the clock output circuit is connected to the receiver circuit through a clock signal line.

4. The semiconductor system according to claim 3, wherein the second clock signal is a signal, a phase of which shifts by 180° from a phase of the first clock signal.

5. The semiconductor system according to claim 4,
wherein the memory device includes a plurality of latch circuits, and
wherein the plurality of latch circuits include:
   latch circuits of a first group configured to latch the data in synchronization with the rise edge of the first clock signal; and
   latch circuits of a second group configured to latch the data in synchronization with the rise edge of the second clock signal.

6. The semiconductor system according to claim 5,
wherein the latch circuits of the first group latch odd-numbered data, and
wherein the latch circuits of the second group latch even-numbered data.

7. The semiconductor system according to claim 6,
wherein the memory device includes a plurality of memory devices arranged so as to be layered on the semiconductor device, and
wherein the plurality of memory devices other than a top memory device of the plurality of memory devices, penetrate each chip and are coupled to the semiconductor device.

8. The semiconductor system according to claim 6,
wherein the memory device includes a plurality of memory devices arranged so as to be layered on the semiconductor device, and
wherein the plurality of memory devices and the semiconductor device are connected by a bonding wire.

9. The semiconductor system according to claim 2,
wherein the driver circuit includes a voltage generating circuit configured to generate a second power supply voltage that is lower than the first power supply voltage and higher than the ground voltage, and
wherein the second power supply voltage is applied to the first electrode of the first N-type MOSFET.

10. The semiconductor system according to claim 1,
wherein the driver circuit includes:
   an output terminal; and
   an output circuit including first and second P-type MOSFETs,
wherein the first power supply voltage is applied to a first electrode of the first P-type MOSFET,
wherein a voltage that is higher than a ground voltage and lower than the first power supply voltage is applied to a first electrode of the second P-type MOSFET, and
wherein a second electrode of each of the first and second P-type MOSFETs is coupled to the output terminal.

11. The semiconductor system according to claim 10,
wherein the output circuit includes:
   a data output circuit configured to output the data; and
   a clock output circuit configured to output the first and second clock signals,
wherein the data output circuit is coupled to the receiver circuit through a data signal line, and
wherein the clock output circuit is coupled to the receiver circuit through a clock signal line.

12. The semiconductor system according to claim 11, wherein a phase of the second clock signal shifts by 180° from a phase of the first clock signal.

13. The semiconductor system according to claim 12, wherein the memory device includes a plurality of latch circuits, and
wherein the plurality of latch circuits include:
   latch circuits of a first group configured to latch data in synchronization with the rise edge of the first clock signal; and
   latch circuits of a second group configured to latch data in synchronization with the rise edge of the second clock signal.

14. The semiconductor system according to claim 13,
wherein the latch circuits of the first group latch odd-numbered data, and
wherein the latch circuits of the second group latch even-numbered data.

15. The semiconductor system according to claim 14,
wherein the memory device includes a plurality of memory devices arranged so as to be layered on the semiconductor device, and
wherein the plurality of memory devices, other than a top memory device of the plurality of memory devices, penetrate each chip and are coupled to the semiconductor device.

16. The semiconductor system according to claim 14,
wherein the memory device includes a plurality of memory devices arranged so as to be layered on the semiconductor device, and
wherein the plurality of memory devices and the semiconductor device are coupled by a bonding wire.

17. A semiconductor system comprising:
a driver circuit configured to output data and a clock signal; and
a receiver circuit configured to receive the data and the clock signal that have been output from the driver circuit,
wherein a first power supply voltage is applied to the driver circuit,
wherein the driver circuit outputs the data, a first clock signal, and a second clock signal,
wherein a phase of the second clock signal by a predetermined amount from the first clock signal,
wherein each amplitude of the data, the first clock signal, and the second clock signal is smaller than an amplitude of the first power supply voltage, and
wherein the receiver circuit inputs the data in synchronization with rise edges of the first and second clock signals.

18. The semiconductor system according to claim 17,
wherein the driver circuit includes:
   an output terminal; and
   an output circuit including first and second N-type MOSFETs,
wherein the first power supply voltage is applied to a first electrode of the first N-type MOSFET,
wherein a ground voltage is applied to a first electrode of the second N-type MOSFET, and
wherein a second electrode of each of the first and second N-type MOSFETs is coupled to the output terminal.

19. The semiconductor system according to claim 18,
wherein the driver circuit includes a voltage generating circuit configured to generate a second power supply voltage that is lower than the first power supply voltage and higher than the ground voltage, and
wherein the second power supply voltage is applied to the first electrode of the first N-type MOSFET.

20. The semiconductor system according to claim 17,
wherein the driver circuit includes:
   an output terminal; and
   an output circuit including first and second P-type MOSFETs, wherein the first power supply voltage is applied to a first electrode of the first P-type MOSFET, wherein a voltage that is higher than a ground voltage and lower than the first power supply voltage is applied to a first electrode of the second P-type MOSFET, and wherein a second electrode of each of the first and second P-type MOSFETs is coupled to the output terminal.

* * * * *